(12) United States Patent
Bahr et al.

(10) Patent No.: US 9,232,289 B2
(45) Date of Patent: Jan. 5, 2016

(54) ACOUSTIC BANDGAP STRUCTURES FOR INTEGRATION OF MEMS RESONATORS

(71) Applicants: Bichoy Bahr, Cambridge, MA (US); Radhika Marathe, Cambridge, MA (US); Wentao Wang, Cambridge, MA (US); Dana Weinstein, Cambridge, MA (US)

(72) Inventors: Bichoy Bahr, Cambridge, MA (US); Radhika Marathe, Cambridge, MA (US); Wentao Wang, Cambridge, MA (US); Dana Weinstein, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/605,489

(22) Filed: Jan. 26, 2015

(65) Prior Publication Data

US 2015/0237423 A1    Aug. 20, 2015

Related U.S. Application Data

(63) Continuation of application No. PCT/US2014/012108, filed on Jan. 17, 2014.

(60) Provisional application No. 61/803,835, filed on Mar. 21, 2013, provisional application No. 61/927,409, filed on Jan. 14, 2014.

(51) Int. Cl.
*H04R 1/00* (2006.01)
*H04R 31/00* (2006.01)

(52) U.S. Cl.
CPC ............... *H04R 1/00* (2013.01); *H04R 31/00* (2013.01); *H04R 2201/003* (2013.01)

(58) Field of Classification Search
CPC ........... H04R 1/08; H04R 9/08; H04R 11/04; H04R 17/02; H04R 21/02; H04R 19/04; H04R 19/005
USPC ........... 381/170–171, 174–176, 369; 257/416
See application file for complete search history.

(56) References Cited

U.S. PATENT DOCUMENTS

| | | | |
|---|---|---|---|
| 7,733,198 B1 | 6/2010 | Olsson et al. | |
| 8,477,983 B2* | 7/2013 | Weigold ................ | H04R 1/406 381/174 |
| 2009/0059464 A1 | 3/2009 | McKinzie | |
| 2009/0152983 A1 | 6/2009 | Sinha et al. | |
| 2009/0295506 A1 | 12/2009 | Handtmann et al. | |
| 2013/0033338 A1 | 2/2013 | Wang et al. | |

OTHER PUBLICATIONS

International Search Report and Written Opinion mailed Oct. 27, 2014, issued for International Patent Application No. PCT/US2014/012108 (9 pages).

Primary Examiner — Suhan Ni
(74) Attorney, Agent, or Firm — Cooley LLP

(57) ABSTRACT

Example acoustic bandgap devices provided that can be fabricated in a semiconductor fabrication tool based on design check rules. An example device includes a substrate lying in an x-y plane and defining an x-direction and a y-direction, an acoustic resonant cavity over the substrate, and a phononic crystal disposed over the acoustic resonant cavity by generating the phononic crystal as a plurality of unit cells disposed in a periodic arrangement. Each unit cell include: (a) at least one higher acoustic impedance structure having a longitudinal axis oriented in the y-direction and a thickness in the x-direction greater than or about equal to a minimal feature thickness of the semiconductor fabrication tool, and (b) at least one lower acoustic impedance material bordering at least a portion of the at least one higher acoustic impedance structure and forming at least a portion of a remainder of the respective unit cell.

31 Claims, 21 Drawing Sheets

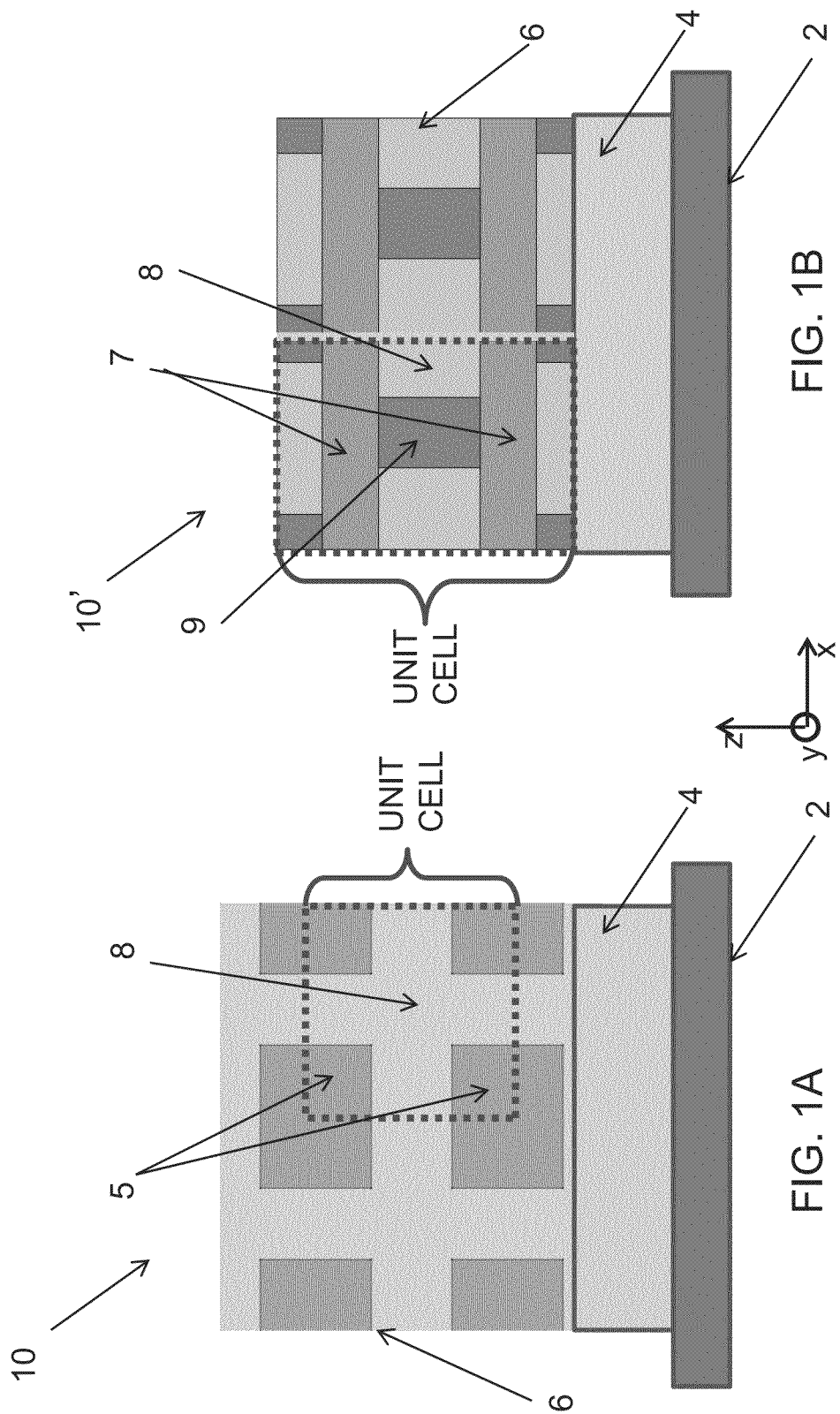

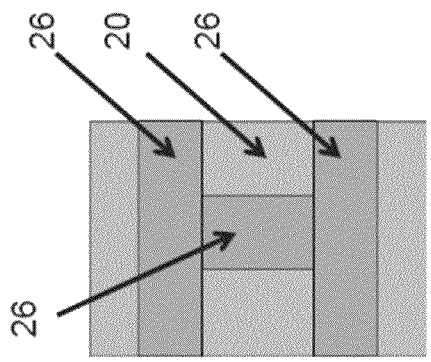
FIG. 2E
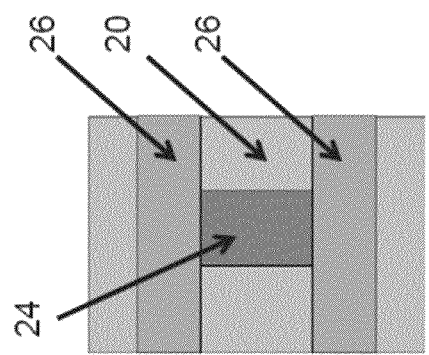
FIG. 2C
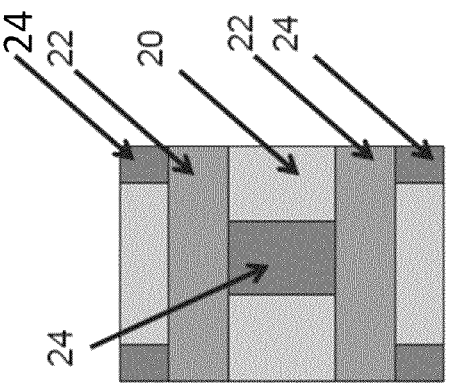
FIG. 2D
FIG. 2A
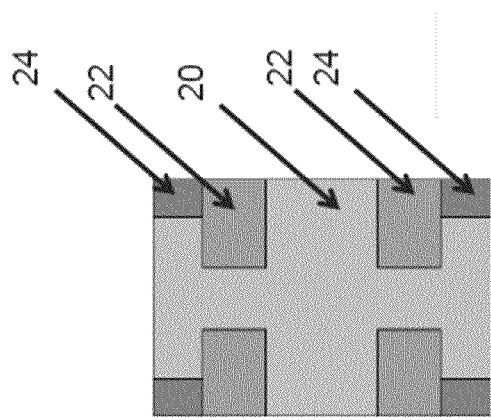
FIG. 2B

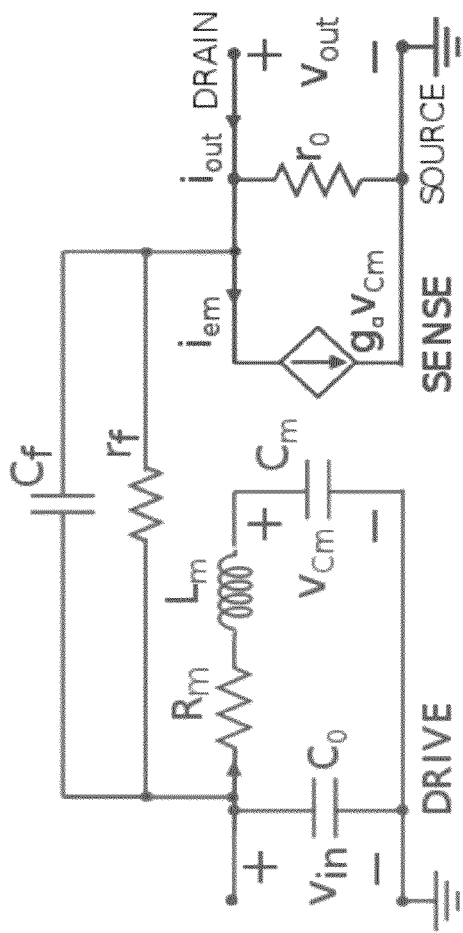
FIG. 16A
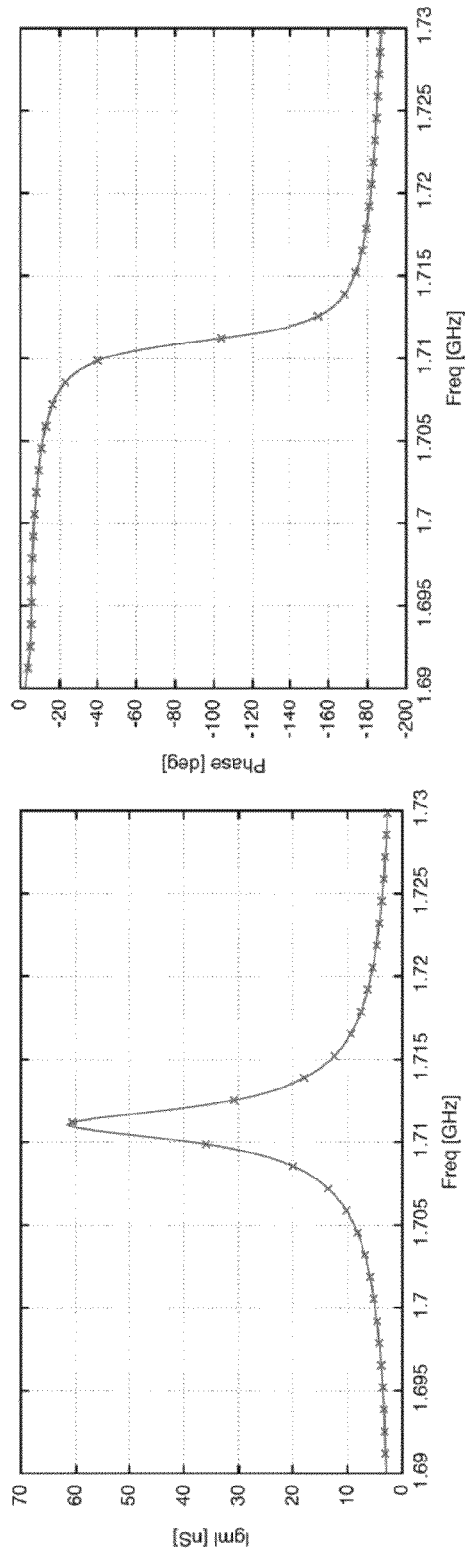
FIG. 16B
FIG. 16C

ACOUSTIC BANDGAP STRUCTURES FOR INTEGRATION OF MEMS RESONATORS

CROSS-REFERENCE TO RELATED APPLICATION

This application claims a priority benefit to PCT application no. PCT/US2014/012108, filed Jan. 17, 2014, entitled "Acoustic Bandgap Structures for Integration of MEMS Resonators", which is hereby incorporated by reference in its entirety, including drawings.

PCT application no. PCT/US2014/012108, filed Jan. 17, 2014, in turn claims a priority benefit to U.S. provisional application No. 61/803,835, filed Mar. 21, 2013, entitled "Phononic Crystals For CMOS integration Of MEMS Resonators," and U.S. provisional application No. 61/927,409, filed Jan. 14, 2014, entitled "ACOUSTIC BANDGAP STRUCTURES FOR INTEGRATION OF MEMS RESONATORS," each of which is hereby incorporated by reference in its entirety, including drawings.

GOVERNMENT SUPPORT

This invention was made with government support under Grant No. N66001-10-1-4046 awarded by the Space and Naval Warfare Systems Center. The government has certain rights in the invention.

BACKGROUND

Microelectromechanical system (MEMS) resonators are electromechanical structures with dimensions at microscale or nanoscale that can be configured to resonate at a wide range of different frequencies. The small size and the range of attainable resonant frequencies allow the usage of MEMS resonators in many different types of applications, such as but not limited to chemical and biological sensing, frequency and time references, telecommunications, microprocessors, and signal filtering.

SUMMARY

Quartz crystals have been used in as the preeminent timing components of most electronic devices. The Inventors have appreciated the benefit of integrating these crystals into smaller semiconductor devices, such as integrated circuits (ICs) built using complimentary metal-oxide semiconductor (CMOS) technologies or other types of semiconductor fabrication technologies. For example, the integration of MEMS resonators with CMOS to form single-chip solutions promises several advantages such as, but not limited to, reduced parasitics from on-chip and off-chip routing for high frequency operation, smaller size and weight, decreased power consumption due to alleviated constraints for impedance matching networks, and the benefits of reduced need for packaging and/or post-processing, and greater robustness to harsh environments.

The Inventors also have appreciated that resonators that are integrated with free-boundary conditions at one or more surfaces, so-called released resonators, could exhibit reduced quality factor, Q, in air, increased anchor loss, increased spurious modes, increased complexity and reduced yield due to the release step, and the need for packaging and/or hermetic sealing in a finished product. Unreleased resonators can allow for seamless integration with CMOS circuits, higher frequency operation, smaller device footprint, high yield and/or relaxed packaging requirements. Furthermore, unreleased resonators devices also may require the construction of a solid-state acoustic resonant cavity using the layers of the CMOS stack to effect elastic energy confinement and high Q values for the resonators. Previous attempts at creating unreleased resonators encapsulated and surrounded by solid material have lacked perfect acoustic reflections at the boundary and exhibited energy losses to the surrounding medium that resulted in a reduced Q as well as output signal. For example, acoustic confinement in bulk CMOS technology can be difficult to achieve due to the absence of acoustic impedance mismatch between the transistors and the silicon (Si) substrate.

In view of the foregoing, various examples described herein are directed generally to systems, apparatus and methods for fabricating an acoustic bandgap device using a semiconductor fabrication tool. A semiconductor fabrication tool has a minimal feature thickness and an allowable via width based on a design rule check. An example acoustic bandgap device includes a substrate lying in an x-y plane defining an x-direction and a y-direction, an acoustic resonant cavity disposed over the substrate, and a phononic crystal disposed over the acoustic resonant cavity. The example phononic crystal includes a plurality of unit cells disposed in a periodic arrangement. Each unit cell includes: (i) at least one higher acoustic impedance structure having a longitudinal axis oriented in the y-direction and a thickness in an x-direction greater than or about equal to the minimal feature thickness of the semiconductor fabrication tool, and (ii) at least one lower acoustic impedance material bordering at least a portion of the at least one higher acoustic impedance structure and forming at least a portion of a remainder of the respective unit cell. The at least one higher acoustic impedance structure includes at least one of: at least one via structure, each via structure having a width in the x-direction about equal to the allowable via width of the semiconductor fabrication tool, and at least one longitudinal bar, each longitudinal bar having a width in the x-direction greater than the width of the at least one via structure. A ratio of an acoustic impedance of the higher acoustic impedance structure to an acoustic impedance of the lower acoustic impedance material is greater than 1.0. The phononic crystal suppresses phononic excitations in at least one frequency band, thereby providing at least one phononic bandgap.

In an example, the higher acoustic impedance structure can include at least one of tungsten, copper, or molybdenum. In another example, the higher acoustic impedance structure can include at least one via structure including tungsten.

In another example, the at least one higher acoustic impedance structure includes at least one longitudinal bar, and where the at least one longitudinal bar has a square-shaped cross-section or a rectangular-shaped cross-section.

In an example, the at least one higher acoustic impedance structure can include at least one via structure and at least one longitudinal bar. As an example, the at least one higher acoustic impedance structure can be formed as a connected-H-shaped structure, a connected-I-shaped structure, or a staggered-I-shaped structure.

In an example, the lower acoustic impedance material is a dielectric material. For example, the dielectric material can include SiCOH, a phosphosilicate glass, an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof. In another example, the lower acoustic impedance material can include a parylene, a polyvinylphenol, a polyvinylalchohol, a polythienylene vinylene, a functionalized pentacene, a polydimethylsiloxane, or any combination thereof. As yet another example, the lower acoustic impedance material can include at least one longitudinal rectangular structure including aluminum.

In an example, the phononic crystal can include at least one layer of the unit cells, formed in a one-dimensional arrangement of the plurality of the unit cells. In another example, the phononic crystal can include at least one layer of the unit cells, each layer including a periodic, two-dimensional arrangement of the plurality of the unit cells.

In an example, the substrate can include silicon, a SOI technology substrate, gallium arsenide, gallium phosphide, gallium nitride, and/or indium phosphide or other example substrate.

In an example, at least one acoustic Bragg reflector structure can be disposed proximate to the resonant cavity.

In an example, the acoustic resonant cavity includes at least one field-effect transistor or at least one capacitor. The acoustic resonant cavity can include at least two field-effect transistors. At least one of the at least two field-effect transistors includes a drive gate or a sensing gate.

The acoustic bandgap device can include a drive mechanism coupled to the resonant cavity. The example drive mechanism can include a metal-insulator-metal (MIM) capacitor, a gate of a metal-oxide-semiconductor field-effect transistor (MOSFET), a p-n junction of a diode, a capacitor, or a bipolar junction transistor.

A coupling of the phononic crystal to the acoustic resonant cavity facilitates confinement in the acoustic resonant cavity of at least one phononic excitation at a frequency in the at least one frequency band.

In an example, the at least one higher acoustic impedance structure can include at least one via structure and at least one longitudinal bar. The at least one longitudinal bar has a first width in the x-direction, thereby generating an acoustic bandgap device having a first bandgap. In an example, a second acoustic bandgap device can be formed having the at least one longitudinal bar with a second width in the x-direction and having a second bandgap that is wider than the first bandgap.

In an example, the semiconductor fabrication tool can be a 0.35 μm complementary metal-oxide-semiconductor (CMOS) fabrication tool, a 0.25 μm CMOS fabrication tool, a 0.18 μm CMOS fabrication tool, a 0.13 μm CMOS fabrication tool, a 65 nm CMOS fabrication tool, a 45 nm CMOS fabrication tool, a 32 nm CMOS fabrication tool, a 22 nm CMOS fabrication tool, a 65 nm silicon-on-insulator (SOI) fabrication tool, a 45 nm SOI fabrication tool, a 32 nm SOI fabrication tool, a 22 nm SOI fabrication tool, a 14 nm FinFET fabrication tool, a 22 nm FinFET fabrication tool, or a III-V semiconductor fabrication tool.

In an example, the acoustic resonant cavity can be fabricated on a portion of the substrate. In another example, an insulator layer can be disposed between a portion of the acoustic resonant cavity and the substrate, such as but not limited to the case of an SOI process.

In an example, at least one radio-frequency micro-electromechanical structure (RF MEMS) device is provided that includes at least one acoustic bandgap device.

In an example, a wireless communication device is provided that includes at least one RF MEMS device.

In an example, a microprocessor is provided that includes at least one RF MEMS device.

Various examples described herein also are directed generally to systems, apparatus and methods for fabricating an acoustic bandgap device using a semiconductor fabrication tool. An example method can include providing a substrate lying in an x-y plane and defining an x-direction and a y-direction, fabricating an acoustic resonant cavity over the substrate, and fabricating a phononic crystal over the acoustic resonant cavity by generating the phononic crystal as a plurality of unit cells disposed in a periodic arrangement. Each unit cell can include: (a) at least one higher acoustic impedance structure having a longitudinal axis oriented in the y-direction and a thickness in an x-direction greater than or about equal to a minimal feature thickness of the semiconductor fabrication tool, and (b) at least one lower acoustic impedance material bordering at least a portion of the at least one higher acoustic impedance structure and forming at least a portion of a remainder of the respective unit cell. The at least one higher acoustic impedance structure can include at least one via structure, each via structure having a width in the x-direction about equal to an allowable via width of the semiconductor fabrication tool, and/or at least one longitudinal bar, each longitudinal bar having a width in the x-direction greater than the width of the at least one via structure. The ratio of the acoustic impedance of the higher acoustic impedance structure to the acoustic impedance of the lower acoustic impedance material is greater than 1.0. The phononic crystal suppresses phononic excitations in at least one frequency band, thereby providing at least one phononic bandgap.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A and 1B show cross-sections of example acoustic bandgap devices, according to the principles described herein.

FIGS. 2A-2E show non-limiting example unit cells of example phononic crystals, according to the principles described herein.

FIGS. 16A-16C show example modeling and computation results, according to the principles described herein.

Figure 3:
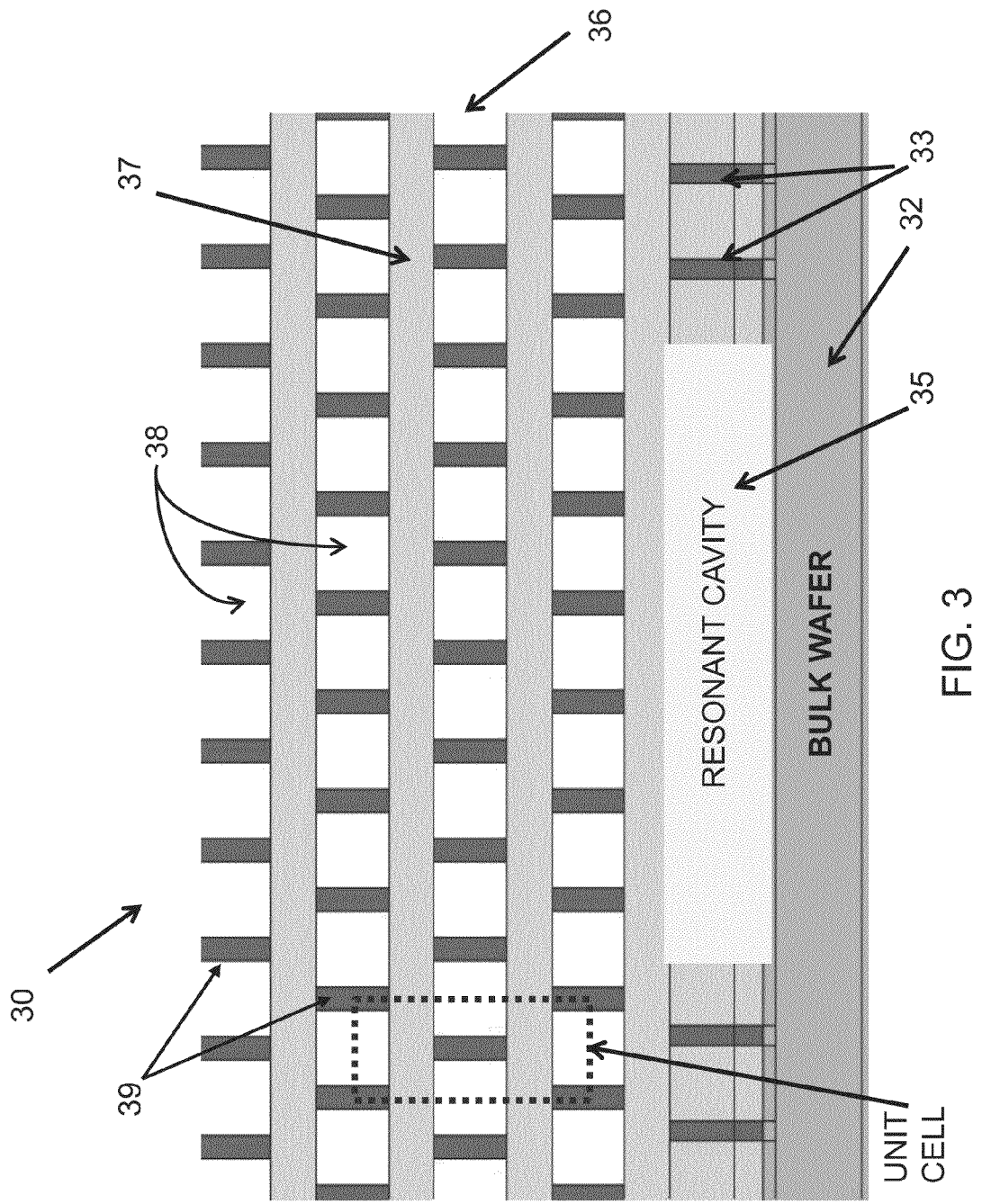
FIG. 3 shows the cross-section of an example acoustic bandgap device, according to the principles described herein.

The features and advantages of the present invention will become more apparent from the detailed description set forth below when taken in conjunction with the drawings.

DETAILED DESCRIPTION

Following below are more detailed descriptions of various concepts related to, and embodiments of, inventive systems, methods and apparatus for providing integrated unreleased MEMS resonators based on acoustic bandgap structures. It should be appreciated that various concepts introduced above and described in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on.

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate (or other surface) and each other. The terms "disposed on" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

According to the example systems, methods and apparatus described herein, unreleased resonators are fabricated with acoustic confinement structures that exhibit significantly enhanced device performance. In the example acoustic bandgap devices, the unreleased resonators described herein are encompassed in solid media isolated from air. As a result, special packaging is not necessary to preserve or ensure device stability. The example device including the unreleased resonators can be operated in extreme environments. In some examples, the phononic crystals and resonant cavities may be defined lithographically rather than by film thickness. This allows for the fabrication of multiple unreleased resonators with different resonance frequencies, adjacent to each other, on the same die/wafer, and using a single set of masks.

The introduction of the example phononic crystals according to the principles described herein facilitates increased acoustic isolation of resonant cavities from the surrounding solid medium and circuits. As a result, the example unreleased resonators described herein can be integrated seamlessly into more complex device structures, such as but not limited to CMOS-integrated MEMS resonators, as a part of the same fabrication process and using the same semiconductor fabrication tools. The example devices exhibit high Q factors, with minimal spurious modes and reduced anchor losses.

According to the principles described herein, example devices can be fabricated that exhibit phononic band structures having wide phononic bandgaps, thereby providing enhanced elastic energy confinement in the resonant cavities.

In any example device herein, acoustic Bragg reflectors (ABRs) can be included proximate to the unreleased resonator cavity to facilitate increased confinement of phonon vibration modes in the example resonant cavity.

According to the principles described herein, the example phononic crystals can be fabricated using the same type of semiconductor fabrication tool as the example acoustic resonant cavities or integrated device structures and using a similar set of materials. The example phononic crystals can be constructed based on combinations of materials with an amount of acoustic impedance mismatch. The example phononic crystals can be fabricated using materials commonly used in semiconductor fabrication technology that exhibit the desired differences in acoustic impedance. Non-limiting examples include copper (Cu), tungsten (W), aluminum (Al), and dielectric materials (such as but not limited to oxides of silicon or tantalum). The example phononic crystals can be fabricated using a patterned arrangement of structures formed from the impedance mismatched materials.

In an example, methods are provided for fabricating unreleased MEMS resonator by configuring acoustically localized phononic crystal structures through patterning of metal layers, vias and dielectric materials. The dielectrics facilitate electrically isolation of neighboring metal structures while providing the desired impedance mismatch. For example, standard CMOS, SOI, III-V or other semiconductor fabrication processes may be used to generate Phononic crystals based on metal routing layers and vias (examples of higher acoustic impedance materials) substantially surrounded by inter-metal dielectric (examples of lower acoustic impedance materials) based on materials used in such semiconductor fabrication processes. In such implementations, for example, the phononic crystals may be fabricated based on several possible different shapes, sizes and configurations of the higher acoustic impedance materials and lower acoustic impedance materials. The different possible configurations of Phononic crystal structures can result in different phononic band structures and bandgaps (both position and width of bandgap energy).

FIGS. 1A and 1B show cross-sections of example acoustic bandgap devices 10, 10' according to the principles described herein, which is fabricated using a semiconductor fabrication tool. As shown in FIG. 1A, an example acoustic bandgap device 10 includes a substrate 2. For the description, it is assumed that the substrate is lying in an x-y plane, an acoustic resonant cavity 4 disposed over the substrate 2, and a phononic crystal 6 disposed over the acoustic resonant cavity 4. The phononic crystal 6 includes a number of unit cells disposed in a periodic arrangement. The unit cell is indicated using the dashed lines in FIG. 1A. In this example, the unit cell includes at least one higher acoustic impedance structure 5 and a lower acoustic impedance material 8 bordering at least a portion of the higher acoustic impedance structure 5. The higher acoustic impedance structure 5 is formed to have a longitudinal axis oriented in the y-direction. The thickness in the x-direction is greater than or about equal to the minimal feature thickness of the semiconductor fabrication tool. The lower acoustic impedance material 8 borders the higher acoustic impedance structure 5 and forms the remainder of the unit cell. As described hereinbelow, the material of the higher acoustic impedance structure 5 and the lower acoustic impedance material 8 are selected from among materials having a degree of acoustic impedance mismatch. Specifically, the materials are selected such that the ratio of the acoustic impedance of the higher acoustic impedance material to that of the lower acoustic impedance material is greater than 1.0. The phononic crystal suppresses phononic excitations in at least one frequency band, thereby providing at least one phononic bandgap.

FIG. 1B shows another example acoustic bandgap device 10' that includes a substrate 2, an acoustic resonant cavity 4 disposed over the substrate 2, and a phononic crystal 6 disposed over the acoustic resonant cavity 4. The phononic crystal 6 includes a number of unit cells disposed in a periodic arrangement. The unit cell is indicated using the dashed lines in FIG. 1B. In this example, the unit cell includes at least one higher acoustic impedance structure (at least one longitudinal bar 7 and at least one via structure 9), and a lower acoustic impedance material 8 bordering at least a portion of the higher acoustic impedance structures (the longitudinal bar 7 and the at least one via structure 9). Each via structure 9 has a width in the x-direction about equal to the allowable via width of the semiconductor fabrication tool. The higher acoustic impedance longitudinal bar structure 7 is formed to have a longitudinal axis oriented in the y-direction. The thickness in the x-direction is greater than or about equal to the minimal feature thickness of the semiconductor fabrication tool. The lower acoustic impedance material 8 forms the remainder of the unit cell. As described hereinbelow, the material of the higher acoustic impedance structures (the longitudinal bar 7 and the at least one via structure 9), and the lower acoustic impedance material 8 are selected from among materials having a degree of acoustic impedance mismatch. Specifically, the materials are selected such that the ratio of the acoustic impedance of the higher acoustic impedance material to that of the lower acoustic impedance material is greater than 1.0. The phononic crystal suppresses phononic excitations in at least one frequency band, thereby providing at least one phononic bandgap.

In any example according to the principles described herein, a longitudinal bar structure can be fabricated to have a longitudinal axis of symmetry oriented in the plane of the substrate of the acoustic bandgap device (such as along the y-axis direction illustrated in FIG. 1B). In some examples, a longitudinal bar structure can be fabricated to run the entire length of the acoustic bandgap device along the longitudinal axis. In other examples, a longitudinal bar structure can be fabricated to run only partially the entire length of the acoustic bandgap device along the longitudinal axis. In such example, the longitudinal bar structures can be staggered relative to each other in that longitudinal axis.

In other examples according to the principles described herein, at least one of the longitudinal bar structure can be replaced by a structure without the longitudinal symmetry, such as but not limited to a structure having approximately equal average dimensions along each of the axes (such as the x-, y-, and z-axes directions illustrated in FIG. 1B). Such example structures also can be staggered relative to each other in the x-, y-, or z-axis direction.

Yet another example acoustic bandgap device can include a substrate, an acoustic resonant cavity disposed over the substrate, and a phononic crystal disposed over the acoustic resonant cavity. The phononic crystal includes a number of unit cells disposed in a periodic arrangement. In this example, the unit cell includes at least one higher acoustic impedance structure formed of at least one via structure and a lower acoustic impedance material bordering at least a portion of the higher acoustic impedance structures (the at least one via structure). Each via structure has a width in the x-direction about equal to the allowable via width of the semiconductor fabrication tool. The lower acoustic impedance material forms the remainder of the unit cell. The materials are selected such that the ratio of the acoustic impedance of the higher acoustic impedance material to that of the lower acoustic impedance material is greater than 1.0. The phononic crystal suppresses phononic excitations in at least one frequency band, thereby providing at least one phononic bandgap.

Yet another example acoustic bandgap device can include a substrate, an acoustic resonant cavity disposed over the substrate, and a phononic crystal disposed over the acoustic resonant cavity. The phononic crystal includes a number of unit cells disposed in a periodic arrangement. In this example, the unit cell includes at least one higher acoustic impedance structure formed of at least one via structure and a lower acoustic impedance material bordering at least a portion of the higher acoustic impedance structures (the at least one via structure). The lower acoustic impedance material can include at least one longitudinal bar structure that is approximately an acoustic impedance match for the lower acoustic impedance material that forms the remainder of the unit cell. Each via structure has a width in the x-direction about equal to the allowable via width of the semiconductor fabrication tool. The materials are selected such that the ratio of the acoustic impedance of the higher acoustic impedance material to that of the lower acoustic impedance material is greater than 1.0. The phononic crystal suppresses phononic excitations in at least one frequency band, thereby providing at least one phononic bandgap.

In any example acoustic bandgap device according to the principles herein, the ratio of the acoustic impedance of the higher acoustic impedance material to that of the lower acoustic impedance material is greater than 1.0, such as but not limited to about 1.1, about 1.2, about 1.4, about 2, about 4, or more. It is observed from the computations that a greater degree of acoustic impedance mismatch can generate a phononic crystal that exhibits a larger bandgap. It is also observed that a phononic crystal with fewer unit cells, but with a greater degree of acoustic impedance mismatch, can cause acceptable confinement in the resonant cavity (thereby generating a device with a smaller footprint).

In any example acoustic bandgap device according to the principles herein, the substrate can be formed from silicon, a SOI technology substrate, gallium arsenide, gallium phosphide, gallium nitride, and/or indium phosphide or other example substrate.

The substrate can work in cooperation with the phononic crystal structure to assist with the confinement of the guided acoustic mode in the resonant cavity. For example, the higher degree of mismatch between the substrate material and the materials of the phononic crystal structure can be a factor in the modeling of the phononic crystal structure and the guided mode in the resonant cavity of the example acoustic bandgap devices. This can be achieved, for example, in acoustic bandgap devices based on SOI technologies, or for III-V acoustic bandgap devices fabricated on silicon substrates.

Table 1 shows values of the acoustic impedance of different materials that can be used in a semiconductor fabrication tool, such as but not limited to a CMOS fabrication tool.

TABLE 1

Mechanical properties for commonly available CMOS materials

| Material | Density (kg/m³) | $c_{11}$ (GPa) | $z_{11}$(MRayl) | $c_{44}$ (GPa) | $z_{44}$ (MRayl) |
|---|---|---|---|---|---|
| Silicon | 2329 | 204.5 | 21.8 | 62.5 | 12.0 |
| $SiO_2$ | 2200 | 75.2 | 12.9 | 29.9 | 8.1 |
| Tungsten | 17600 | 525.5 | 96.2 | 160.5 | 53.1 |
| Copper | 8700 | 176.5 | 39.1 | 40.7 | 18.8 |
| Aluminum | 2735 | 111.1 | 17.4 | 28.9 | 8.9 |
| SiN | 3300 | 387 | 35.75 | 122 | 20 |

Based on the values shown in Table 1, in some examples, the lower acoustic impedance material can be formed from materials such as but not limited to a dielectric (such as but not limited to $SiO_2$) or even a metal (such as but not limited to aluminum). The higher acoustic impedance structure can be formed from such materials as copper (used for forming metallization in a semiconductor fabrication tool) or tungsten (used for forming vias). These materials used for metallization can be fabricated into any of the horizontal bar structures described herein. Based on the values shown in Table 1, in other examples, the higher acoustic impedance structure also can be formed from a dielectric. As a non-limiting example, higher acoustic impedance structure can be formed from a silicon nitride (SiN). In some examples, a configuration of a higher acoustic impedance structure formed from a dielectric, such as but not limited to SiN, and a lower acoustic impedance material being formed from a metal, such as but not limited to aluminum, can present a high degree of acoustic impedance mismatch. Based on the values shown in Table 1, an acoustic impedance mismatch ratio of about 2-3 is achievable for a system based on SiN and Al. In other examples, the lower acoustic impedance material can include a polymer, such a but not limited to a parylene, a polyvinylphenol, a polyvinylalchohol, a polythienylene vinylene, a functionalized pentacene, a polydimethylsiloxane, or any combination thereof.

FIGS. 2A-2E show non-limiting example unit cells formed from materials that are used in a semiconductor fabrication tool. For example, the unit cell in FIG. 2A is formed from the lower acoustic impedance materials of an oxide 20 (such as but not limited to $SiO_2$) and aluminum 22, while the higher acoustic impedance structures are formed from tungsten 24 (e.g., as vias). In the example unit cell of FIG. 2B is also formed from the lower acoustic impedance materials of an oxide 20 (such as but not limited to $SiO_2$) and aluminum 22, while the higher acoustic impedance structures are formed from tungsten 24 (e.g., as vias). However, the symmetry of the components of the unit cell differs in FIG. 2B from FIG. 2A. The example unit cell of FIG. 2C is formed from the lower acoustic impedance material of an oxide 20 (such as but not limited to $SiO_2$), while the higher acoustic impedance structures are formed from tungsten 24 (e.g., as vias) and copper (as metallization structures). The example unit cell of FIG. 2D is formed from the lower acoustic impedance material of an oxide 20 (such as but not limited to $SiO_2$), while the higher acoustic impedance structures are formed from aluminum 22 (which has a somewhat higher acoustic impedance by comparison). The example unit cell of FIG. 2E is formed from the lower acoustic impedance material of an oxide 20 (such as but not limited to $SiO_2$) and the higher acoustic impedance structures are formed from copper (as metallization structures).

Given that the acoustic impedance of $SiO_2$ and Al are substantially similar, they are approximately an acoustic impedance match. In such an example, the aluminum can be introduced into the phononic crystal structure as a lower acoustic impedance structure along with the $SiO_2$. The copper metallization and/or tungsten vias can be used as the higher acoustic impedance structure.

In any example herein, the substrate can be formed from silicon or any other substrate that can be used in semiconductor fabrication technology In any example, the at least one higher acoustic impedance structure can be formed from at least one longitudinal bar that has a square-shaped cross-section, a rectangular-shaped cross-section, a circular-shaped cross-section, an oval-shaped cross-section, a triangular-shaped cross-section, a hexagonal-shaped cross-section, or other polygonal-shaped cross-section.

In some examples, the higher acoustic impedance structure can be formed from at least one of tungsten, copper, or molybdenum. In some examples, the higher acoustic impedance structure can be formed from at least one via structure formed from tungsten.

In some examples, the lower acoustic impedance material can be a dielectric material. For example, the dielectric material can be, but is not limited to, SiCOH, a phosphosilicate glass, an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof. In some examples, the lower acoustic impedance material can be, but is not limited to, a parylene, a polyvinylphenol, a polyvinylalchohol, a polythienylene vinylene, a functionalized pentacene, a polydimethylsiloxane, or any combination thereof.

In some examples, the lower acoustic impedance material can be at least one longitudinal rectangular structure formed from aluminum.

In any example according to the principles descried herein, the phononic crystal of the acoustic bandgap device can be formed from a patterned arrangement of a plurality of the unit cells. For example, as shown in FIGS. 1A and 1B, the phononic crystal 6 of the acoustic bandgap device can be formed from two or more unit cells. In other examples, the acoustic bandgap device can be formed from a greater number of unit cells, such as but not limited to at least 5, at least 10, at least 20, at least 40, at least 70, at least 120, at least 200 or more unit cells.

In some examples, the phononic crystal of the acoustic bandgap device can be formed from a one-dimensional (1-D) patterned arrangement of the plurality of the unit cells. In other examples, the phononic crystal of the acoustic bandgap device can be formed from a two-dimensional (2-D) patterned arrangement of the plurality of the unit cells or a three-dimensional (3-D) patterned arrangement of the plurality of the unit cells.

In some examples, the phononic crystal of the acoustic bandgap device can be formed from a monolayer of the patterned arrangement of the plurality of the unit cells, whether the unit cells are arranged as a one-dimensional (1-D), two-dimensional (2-D), or three-dimensional (3-D) structure. In other examples, the phononic crystal of the acoustic bandgap device can be formed from two layers, three layers, five layers, eight layers, or more, of the patterned arrangement of the plurality of the unit cells, whether the unit cells are arranged as a one-dimensional (1-D), two-dimensional (2-D), or three-dimensional (3-D) structure.

In the semiconductor fabrication industry, a given generation semiconductor fabrication tool has certain restrictions in its fabrication parameters. The semiconductor fabrication tool generally provides a certain degree of control of dimensions of features in the x-y plane. For example, there is a minimal feature thickness of the given fabrication tool in the x-direction. There is also a certain degree of control of the dimensions in the y-direction of the given semiconductor fabrication tool. Each given semiconductor fabrication tool also presents a certain allowable via width based on a design rule check (DRC) of the semiconductor fabrication tool. There can be somewhat less control over the z-direction thickness of the features of the structures fabricated in the tool. That is, in a given semiconductor fabrication tool, such as a commercially available tool, the phononic crystal is configured based on the allowable and accessible features dimensions, and using the acoustic impedance mismatch of the material, that are attainable and allowable in the semiconductor fabrication tool. Accordingly, in any phononic bandgap device herein, the arrangement of the higher acoustic impedance structures and the lower acoustic impedance materials are configured, bearing in mind the allowed thicknesses of features in the z-direction, to generate a phononic crystal with at least one phononic bandgap across a frequency band.

In any example according to the principles descried herein, the semiconductor fabrication tool can be a 0.35 μm complementary metal-oxide-semiconductor (CMOS) fabrication tool, a 0.25 μm CMOS fabrication tool, a 0.18 μm CMOS fabrication tool, a 0.13 μm CMOS fabrication tool, a 65 nm CMOS fabrication tool, a 45 nm CMOS fabrication tool, a 32 nm CMOS fabrication tool, a 22 nm CMOS fabrication tool, a 65 nm silicon-on-insulator (SOI) fabrication tool, a 45 nm SOI fabrication tool, a 32 nm SOI fabrication tool, a 22 nm SOI fabrication tool, a 14 nm FinFET fabrication tool, a 22 nm FinFET fabrication tool, or a III-V semiconductor fabrication tool. As described above, the example acoustic bandgap structures can be formed from the available materials used in fabricating devices in each given semiconductor fabrication tool, provided the selection of materials present the desired degree of acoustic impedance mismatch for forming the unit cells of the phononic crystal lattices according to the principles described herein.

FIG. 3 show the cross-section of an example acoustic bandgap device 30 that is formed of a substrate 32, an acoustic resonant cavity 35 disposed over the substrate 32, and a phononic crystal 36 disposed over the acoustic resonant cavity 35. The phononic crystal 36 includes a number of unit cells disposed in a periodic arrangement. The unit cell is indicated using the dashed lines in FIG. 3. In this example, the unit cell includes at least one higher acoustic impedance structure (at least one longitudinal bar 37 and at least one via structure 39), and a lower acoustic impedance material 38 bordering at least a portion of the higher acoustic impedance structures (the longitudinal bar 37 and the at least one via structure 39). Each via structure 39 has a width in the x-direction about equal to the allowable via width of the semiconductor fabrication tool. The higher acoustic impedance longitudinal bar structure 37 is formed to have a longitudinal axis oriented in the y-direction. The lower acoustic impedance material 38 forms the remainder of the unit cell. As described hereinbelow, the material of the higher acoustic impedance structures (the longitudinal bar 37 and the at least one via structure 39), and the lower acoustic impedance material 38 are selected from among materials having a degree of acoustic impedance mismatch, such that the ratio of the acoustic impedance of the higher acoustic impedance material to that of the lower acoustic impedance material is greater than 1.0. In this example, the phononic crystal of the acoustic bandgap device is formed as a three-dimensional (3-D) patterned arrangement of the plurality of the unit cells. The phononic crystal suppresses phononic excitations in at least one frequency band, thereby providing at least one phononic bandgap.

As shown in the example of FIG. 3, at least one ABR 33 can be fabricated proximate to the acoustic resonant cavity 35. In other examples, no acoustic Bragg reflectors are fabricated proximate to the acoustic resonant cavity 35.

In some example implementations, metals such as copper and tungsten may be patterned as rods in 2D and/or 3D periodic dielectric lattice structures. For example, ABRs may be viewed as a 1-D phononic crystal implementation where metals are patterned to form alternate metal/dielectric regions of quarter wavelengths in any direction.

Figure 4:
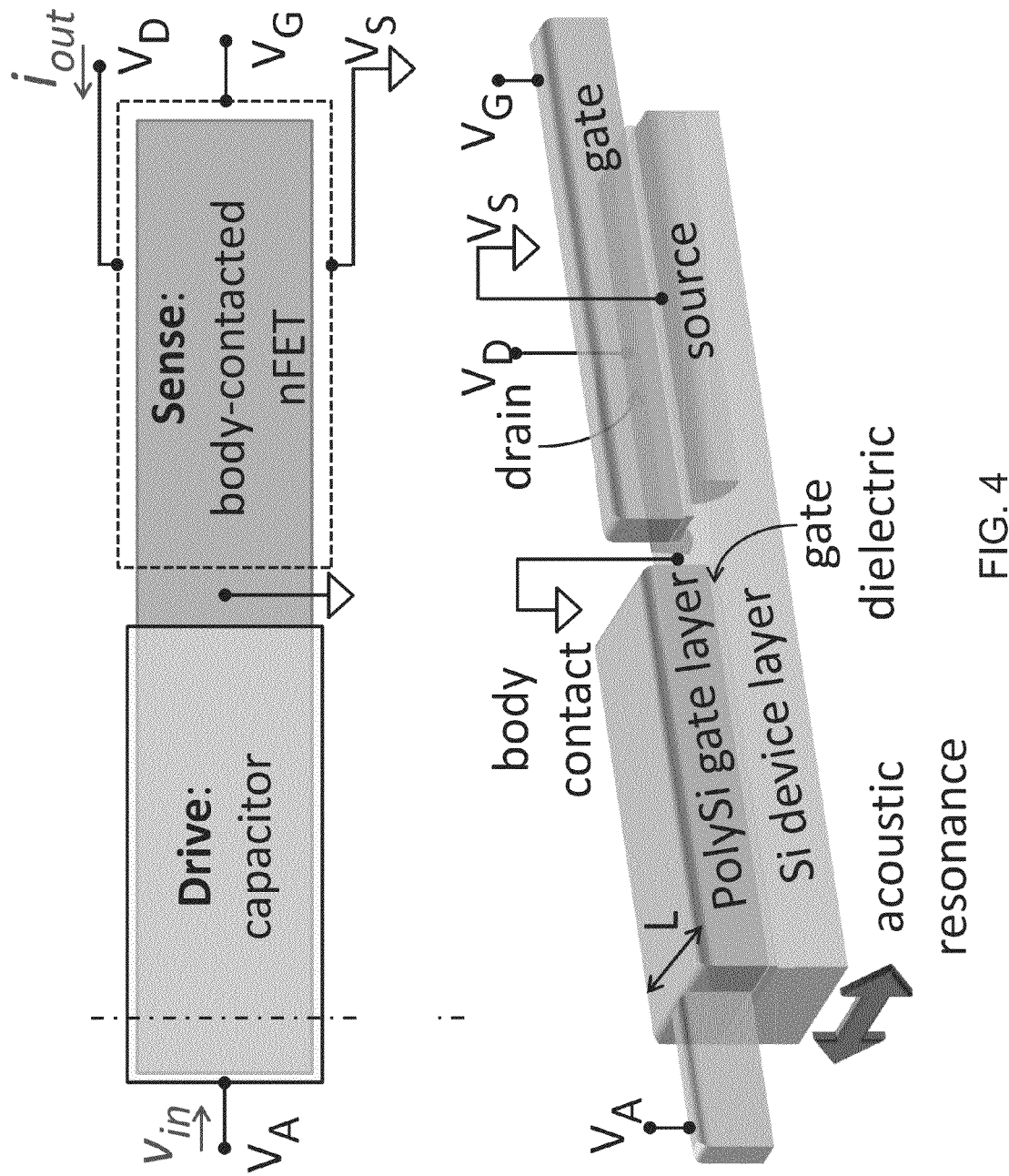
FIG. 4 shows top and side views of an example acoustic resonant cavity, according to the principles described herein.

FIG. 4 shows top and side views of an example acoustic resonant cavity that can be formed in the example acoustic phononic bandgap devices according to the principles herein. In this example, the acoustic resonant cavity includes at least one field-effect transistor or at least one capacitor. In other examples, the example acoustic resonant cavity can include at least two field-effect transistors. At least one of the at least two field-effect transistors can be a drive gate or a sensing gate.

In an example, the acoustic resonant cavity is fabricated on a portion of the substrate. In an example, an insulator layer is disposed between a portion of the acoustic resonant cavity and the substrate.

In an example, the acoustic bandgap device can include a drive mechanism coupled to the resonant cavity. The drive mechanism can include a metal-insulator-metal (MIM) capacitor, a gate of a metal-oxide-semiconductor field-effect transistor (MOSFET), a p-n junction of a diode, a capacitor, or a bipolar junction transistor.

Figure 5:
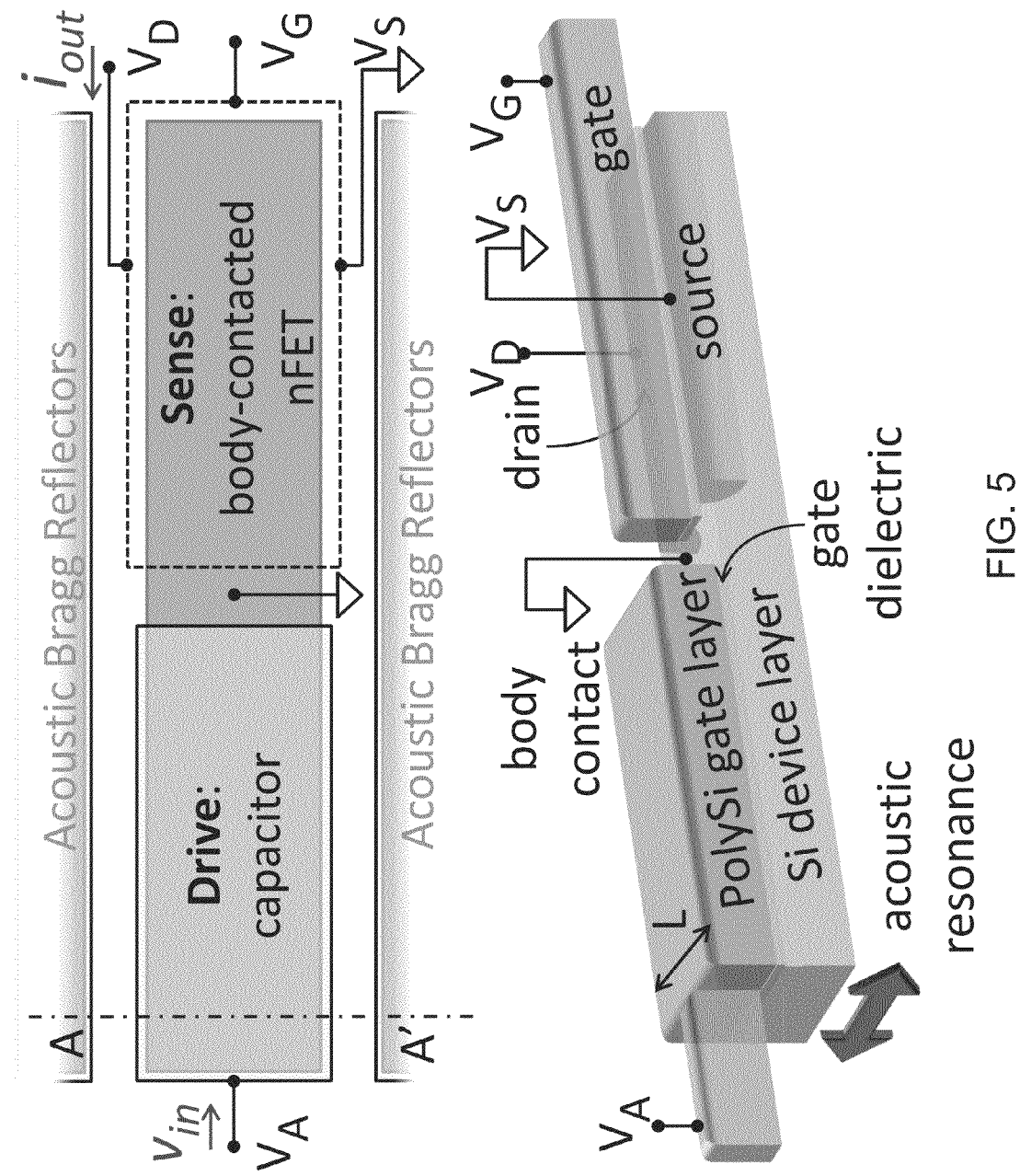
FIG. 5 shows top and side views of an example acoustic resonant cavity and acoustic Bragg reflectors, according to the principles described herein.

FIG. 5 shows top and side views of another example according to the principles herein in which acoustic Bragg reflectors are formed the example acoustic phononic bandgap devices proximate to the acoustic resonant cavity. In this example, the acoustic resonant cavity can include at least one field-effect transistor or at least one capacitor.

Figure 6:
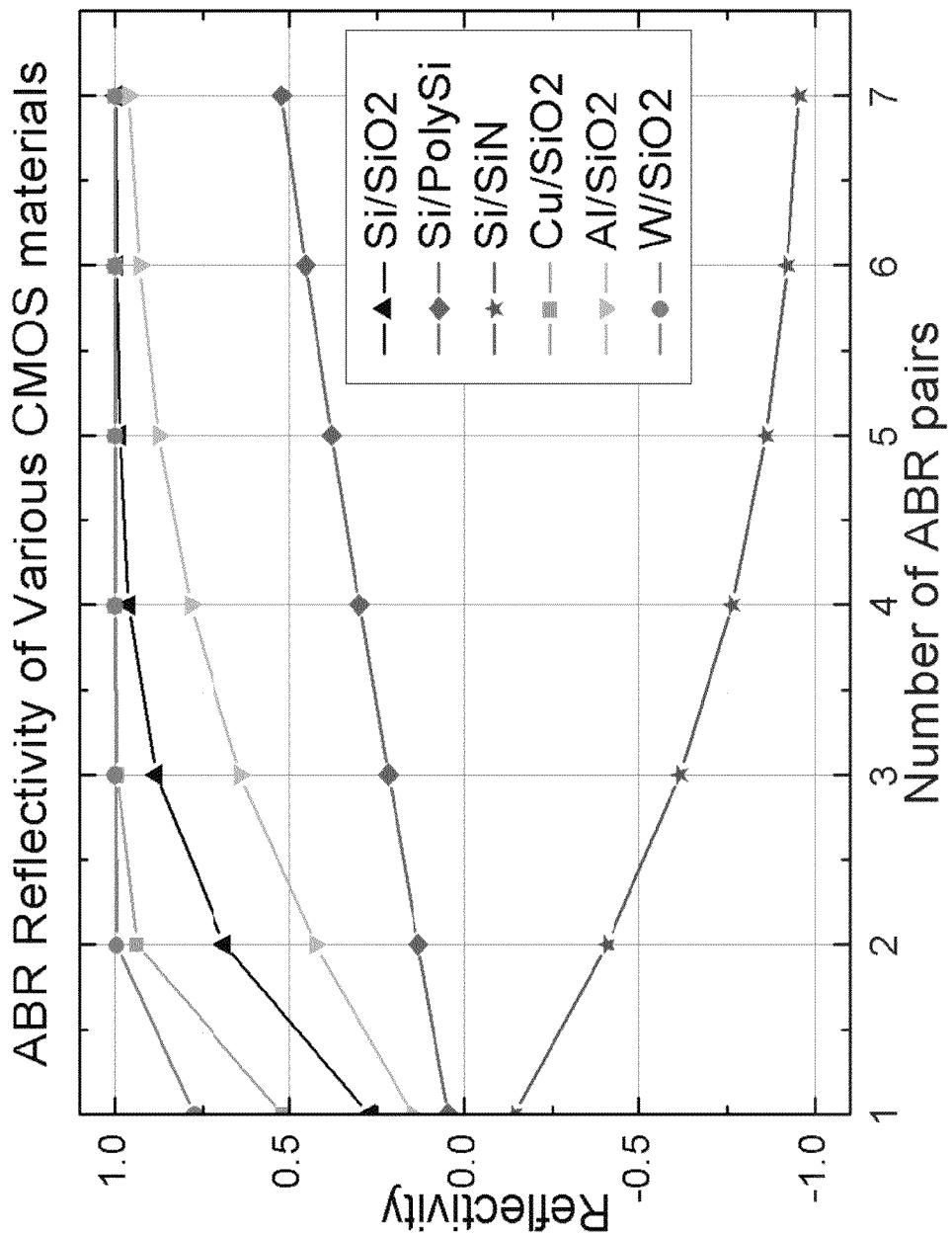
FIG. 6 shows a plot of the reflectivity of example acoustic Bragg reflector pairs for various materials, according to the principles described herein.

FIG. 6 shows an example plot of reflectivity versus number of ABR pairs. FIG. 6 shows the increase in reflectivity with increasing numbers of ABR pairs for material combinations easily found in standard CMOS technology. It can be observed from FIG. 6 that materials with a larger acoustic mismatch converge to an absolute reflectivity of 1 with fewer numbers of ABR pairs. In some example implementations, the material combinations that present larger acoustic impedance contrast for ABR pairs can be used to generate devices with smaller device footprint and with the same level of reflectance as compared to devices generated from combinations of materials with smaller acoustic impedance contrast. For example, as shown in FIG. 6, desirable material combinations for configuring ABRs with the goal of minimizing footprint, i.e., the number of ABR pairs to maintain net reflectivity, can be tungsten with $SiO_2$ ($W/SiO_2$) and/or copper with $SiO_2$ ($Cu/SiO_2$). Similar considerations of acoustic impedance mismatch can be made in connection with the phononic crystal lattices according to the principles described herein.

Figure 7A:
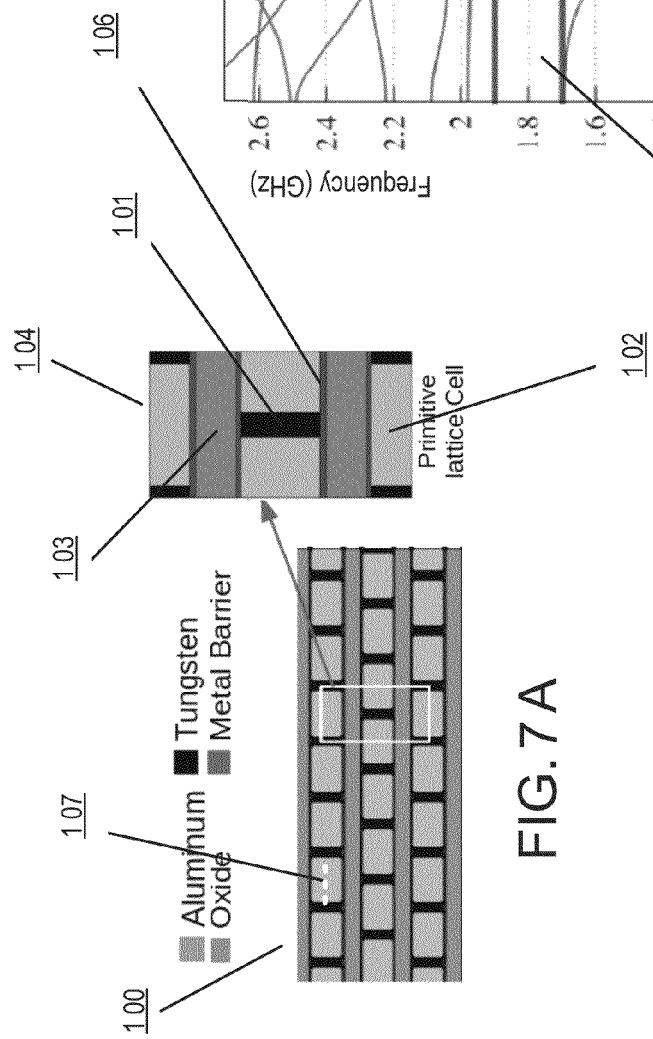
FIGS. 7A-7C show an example phononic crystal lattice, the associated primitive unit cell and the computed phononic band structure, according to the principles described herein.
Figure 7C:
Figure 7B:
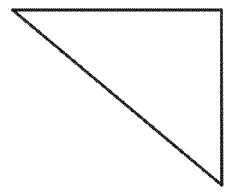

In an example, the phononic crystals 100 may be artificially structured periodic materials generated from a regularly repeated arrangement of unit cells 104 in a lattice structure, e.g., FIG. 7A. FIG. 7A shows an example of a phononic lattice structure formed from an "I" shaped unit cell 104 that includes higher acoustic impedance vias 101, lower acoustic impedance materials 102 and 103, and structures 106 formed from metallization layers. In this non-limiting example, the vias 101 are formed tungsten, the structures 106 are formed as metal barriers, the lower acoustic impedance material 102 is formed from a dielectric (such as an oxide), and the lower acoustic impedance material 103 is formed from a metal (such as an aluminum metallization layer). FIG. 7B shows an example of the Brillouin zone for the phononic lattice structure shown in FIG. 7A that can be used in the computation. In any example phononic crystal herein, the periodic nature of the phononic lattices gives rise to collective elastic excitations, i.e., phonons, which are allowed to occupy a restricted range of energy levels, as shown in the phononic band diagram of a given phononic lattice. FIG. 7C shows an example phononic band diagram that can be computed for the example phononic crystal lattice shown in FIG. 7A. As shown in FIG. 7C, a phononic bandgap of approximately in width 200 MHz exists in the band diagram at around 1.8 GHz frequency.

In this example computation, the forbidden energy levels are the bandgaps 105 where there is no collective excitation, allowing the suppression of phonon propagation in crystals. For example, an acoustic bandgap device may be configured such that elastic waves may not propagate in the crystal lattice in at least one direction, in two directions, or in all three directions. In FIG. 7A, an example phononic crystal lattice, formed from a staggered arrangement of "I" shaped unit cells including tungsten vias 101, aluminum metallization layers 103 and oxide as inter-layer dielectric filler 102, has a bandgap of around 200 MHz around 1.8 GHz frequency. In some example implementations, through design of dimensions, periodicity and properties of constituent materials, these bandgaps or deaf bands can be engineered in the phononic crystal dispersion relations. As a result, the example phononic crystals are suitable structures for defining an acoustic resonance cavity. For example, an acoustic bandgap device can be configured to have an increased phononic bandgap by increasing the contrast of acoustic impedances between the materials forming the unit cell of the phononic lattice. A wide selection of high quality materials with favorable characteristics for example phononic crystal implementations are readily available in a semiconductor process, such as but not limited to CMOS processes. For example, tungsten vias in CMOS with $SiO_2$ matrix can be patterned into periodic structures resulting in a phononic crystal lattice structure with large acoustic impedance mismatch between constituent materials. Hence, a large bandgap appears in the band structure, making it suitable for acoustic confinement. Table 1 lists example acoustic impedance values Z, along with other mechanical properties, for some of the commonly available semiconductor fabrication materials. As is clear from Table 1, the largest impedance contrast can be achieved for the combination of $W/SiO_2$, while the combination of $Cu/SiO_2$ also presents a desirable degree of acoustic impedance mismatch.

As such, in these example implementations, example combinations of tungsten and copper with $SiO_2$ provide optimal combinations for configuring phononic crystal structures for acoustic confinement. For example, in CMOS stacks, tungsten may be used in metal vias to couple the bulk to the first metal layer as well as in vias between successive metal layers. Also, in some example implementations, the vias may be surrounded by routing metallization enclosures 106, as used in many foundries, an example of a metallization option in CMOS processes being copper. In some example implementations, the ease of patterning copper, and the less stringent DRCs on metal layers than on vias in semiconductor fabrication technology, can provide for more flexibility in the bandgap engineering. In some example implementations, aluminum may be used for patterning metallization layers for design rule check (DRC) compliant designs without disturbing the phononic crystal configuration due to the closeness of the impedance values of Al to $SiO_2$, as is provided in Table 1. In some example implementations, these metals may be surrounded by a dielectric material, such as but not limited to phosphosilicate glass (PSG), $SiO_2$, amorphous $SiO_2$, and SICOH, to electrically isolate adjacent metal layers and vias from each other. For example, such dielectrics may have low acoustic impedance values and in combination with the metal/via layers. The dielectrics lend themselves to forming efficient phononic crystals and ABRs, especially for copper metallization and tungsten vias.

In some example implementations, vertical dimensions such as vias size may have fixed size requirements based on design rule checks (DRC) provided by foundries. Horizontal dimension constraints such as the spacing between the vias may be sufficiently relaxed to allow for engineering of acoustic bandgaps. In implementing the phononic crystal, long rectangular tungsten vias may be used over a silicon oxide background, as is the case in some CMOS technologies. In some example implementations, the use of rectangular vias covering substantially the length of the resonator can generate a phononic crystal as a two dimensional structure. With a few metal layers available to implement the phononic crystal, in some example implementations, the choices of two-dimensional periodic configurations available to pattern the phononic crystal lattice may become limited by the requirement to maintain adequate periodicity in the vertical direction. In some example implementations, the limitation can become more stringent when the minimum allowable via dimension changes in going to higher layers up the metallization stack of the phononic crystal. An example pattern that exploits the above-mentioned change in via dimensions in higher layers is the staggered pattern of FIG. 7A formed from "I" shaped unit cells. Other example patterns of phononic crystal lattices, and the phonon band diagram computed for each respective phononic crystal lattice, are shown in FIGS. 11A-11B, 12A-12B, 13A-13B, 14A-14B, and 15A-15B, described in greater detail hereinbelow.

In some example implementations, the vertical dimensions may be specified by the CMOS process. For better manufacturability, the vias width may be kept at the typical dimension designated by the process. In these example implementations, the vias separation is a parameter available to adjust the phononic crystal performance to fabricate a structure with desired phononic bandgap properties.

Figure 8D:
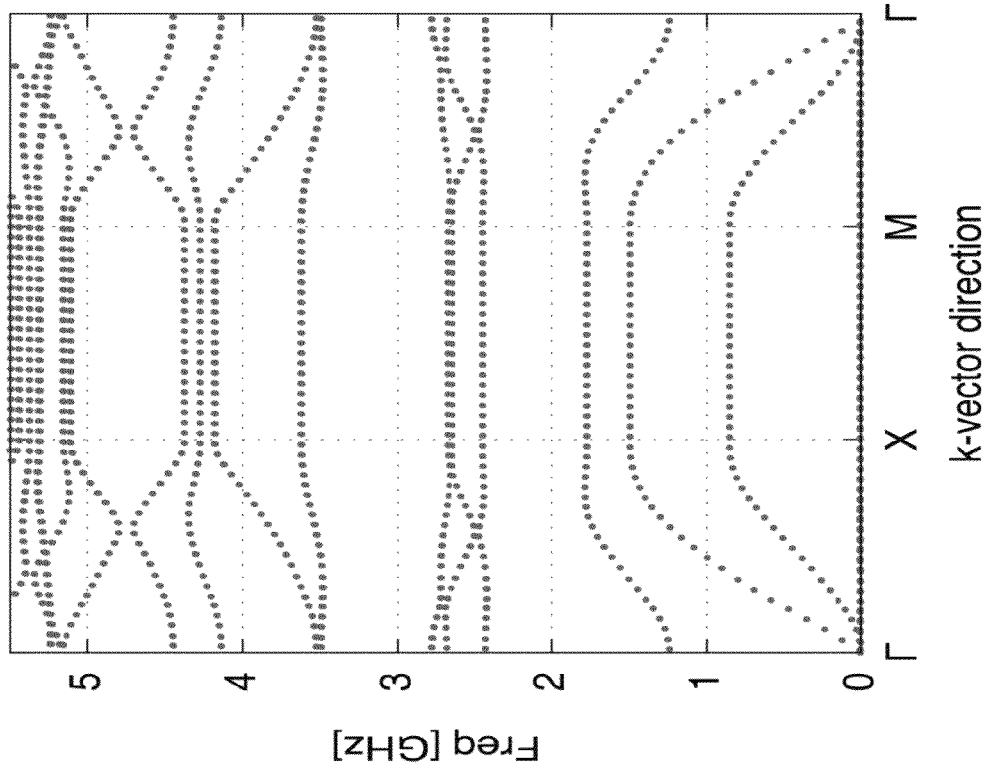
FIG. 8D shows example FEM computation results of acoustic band structure, according to the principles described herein.
Figure 8A:
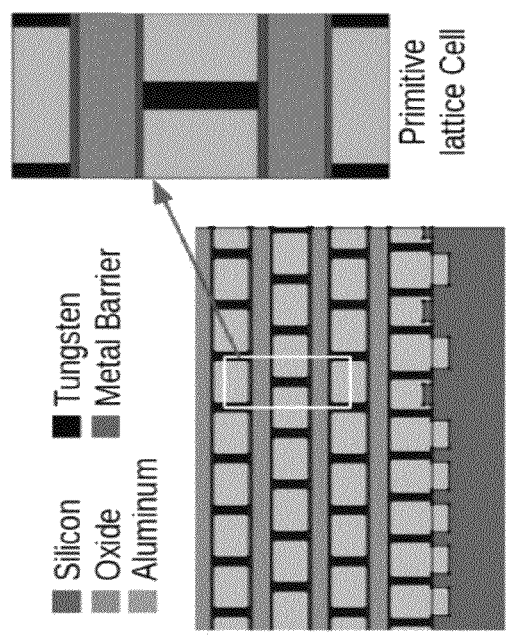
FIG. 8A shows a cross-section of an example acoustic bandgap device, according to the principles described herein.

A non-limiting example computation of a phononic band diagram based on a phononic crystal structure is described in connection with FIGS. 8A-8D, based on use of a CMOS 0.18 μm semiconductor fabrication technology. FIG. 8A shows the example phononic crystal lattice formed form the periodic arrangement of long rectangular tungsten vias and the unit cell, also referred to as primitive lattice cell. The unit cell is the minimum-volume cell that can generate the phononic crystal by repetitive translations, according to the translation vector T:

$$\vec{T} = u_1 \vec{a_1} + u_2 \vec{a_2} + u_3 \vec{a_3} \quad (1)$$

where $\vec{a_1}$ are the lattice axes and $u_i$ are integers, with i=1, 2, 3. According to Bloch theorem, the wave solution displacement field u(r) in the crystal can be expressed as:

$$u(r) = e^{j\vec{k} \cdot r} u_{\vec{k}}(r) \quad (2)$$

where $u_{\vec{k}}(r)$ is a periodic function, with the same space periodicity as the lattice. The wave vector $\vec{k}$ assumes values from the reciprocal lattice. The reciprocal lattice axis vectors are given by:

$$\vec{b_1} = 2\pi \frac{\vec{a_2} \times \vec{a_3}}{\vec{a_1} \cdot \vec{a_2} \times \vec{a_3}}; \vec{b_2} = 2\pi \frac{\vec{a_1} \times \vec{a_3}}{\vec{a_1} \cdot \vec{a_2} \times \vec{a_3}}; \vec{b_3} = 2\pi \frac{\vec{a_1} \times \vec{a_2}}{\vec{a_1} \cdot \vec{a_2} \times \vec{a_3}} \quad (3)$$

For the example computation, with the unit cell having width a and length b, the lattice vectors are given by:

$$\vec{a_1} = a\hat{x}; \vec{a_2} = b\hat{y} \quad (4)$$

The reciprocal lattice vectors are given by:

$$\vec{b_1} = \frac{2\pi}{a}\hat{x}; \vec{b_2} = \frac{2\pi}{b}\hat{y} \quad (5)$$

Figure 8B:
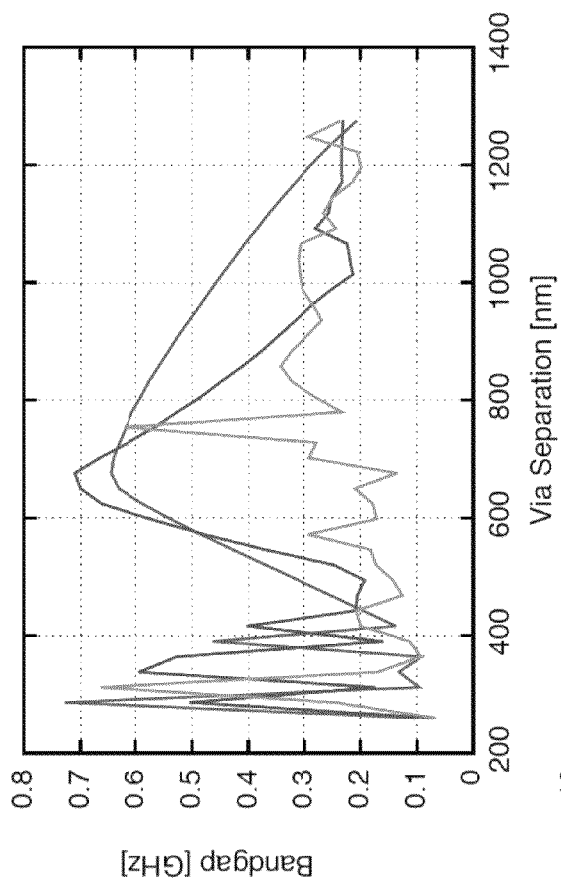
FIGS. 8B-8C show example finite-element (FEM) computation results of via separation and bandgap center frequencies, according to the principles described herein.
Figure 8C:
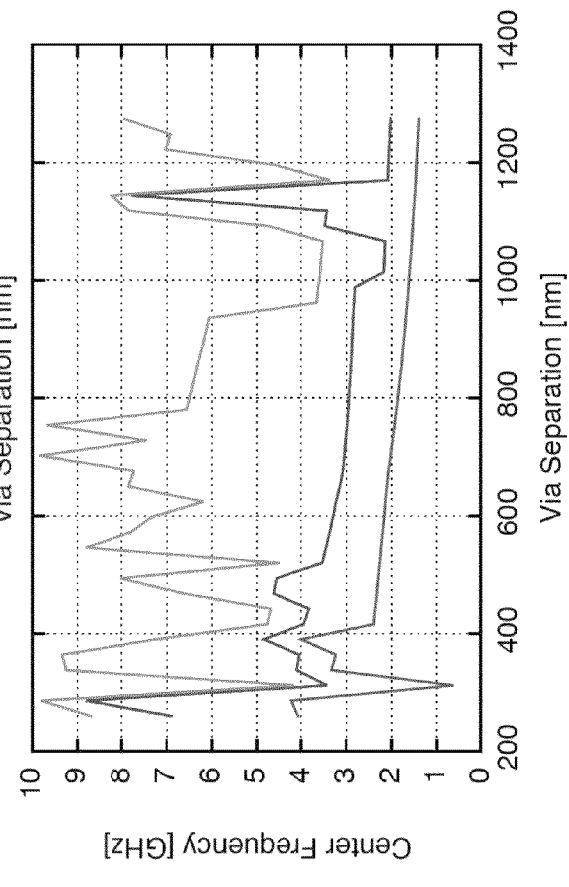

The solution, wave solution displacement field u(r), is unique for $\vec{k}$-values up to the first Brillouin zone of the reciprocal lattice. It can be sufficient to scan the wave vector $\vec{k}$ along the edge of the first Brillouin zone. Also, as the reciprocal lattice is symmetric, scanning the wave vector $\vec{k}$ in the sequence:

$$\frac{k_x a}{\pi}: 0 \to 1 \to 1 \to 0$$

$$\frac{k_y b}{\pi}: 0 \to 0 \to 1 \to 0$$

can be sufficient to obtain a fully representative $\omega-\vec{k}$ dispersion relation. A FEM simulation is used to analyze the phononic crystal structure. For the computation, via separation is varied. FIGS. 8B and 8C show plots of the computation results, showing the widths of the largest three bandgaps (FIG. 8B) and respective gap center frequencies (FIG. 8C) for the modeled variations of acoustic bandgap devices having different via separations. In the example plots, the minimum allowable via separation is about 250 nm. The plots in FIGS. 8B and 8C show the results for the largest three bandgaps arranged in ascending order of frequency, versus via separation.

It is desirable to generate an example acoustic bandgap device having at least one wide bandgap. Setting the resonance frequency in the device application to be at the center of a wide bandgap can guarantee high reflectivity from the phononic crystal lattice, resulting in acoustic bandgap device with fewer numbers of required phononic crystal lattice layers. In addition, an example acoustic bandgap device configured to have at least one wide bandgap can cause the phononic crystal lattice to be more tolerant to process variations, while still maintaining acceptably high reflectivity.

In an example implementation according to the principled described herein, based on the modeled characteristic frequencies of an example phononic lattice, fabrication parameters such as but not limited to via separation, can be determined. For example, a simulation can be carried out for the a structure such as shown in FIG. 8A, based on a standard CMOS process with typically used materials, such as but not limited to tungsten vias with aluminum routing metal on a silicon dioxide substrate. The width of the vias in the x-direction used for the example simulation is about 260 nm and the height in the y-direction is about 850 nm. The height of the metal routings used in the simulation is about 550 nm. The phononic crystal unit cell can be modeled with a via separation of about 250 nm to about 1300 nm as a candidate range. FIGS. 8B and 8C show that, for this example configuration, the via separation of about 700 nm can be optimal for fabricating an example phononic crystal lattice with the largest bandgap. For example, FIG. 8D shows the dispersion relation computed for the example phononic crystal lattice shown in FIG. 8A with a via separation of about 700 nm. The dispersion relation shows that large bandgaps at around 2 GHz and 3 GHz frequencies may be attainable for this example phononic crystal lattice. This example approach may be applied to any semiconductor fabrication tool, for modeling and generating any example phononic crystal lattice, based on the dielectrics and metal available in the process, along with the design rule check (DRC) requirements of the semiconductor fabrication tool.

While examples of phononic crystal lattices are described herein relative to a rectangular unit cell, in other examples, the unit cells can have other symmetries, such as but not limited to a square symmetry, a hexagonal symmetry or a triangular symmetry.

Figure 9A:
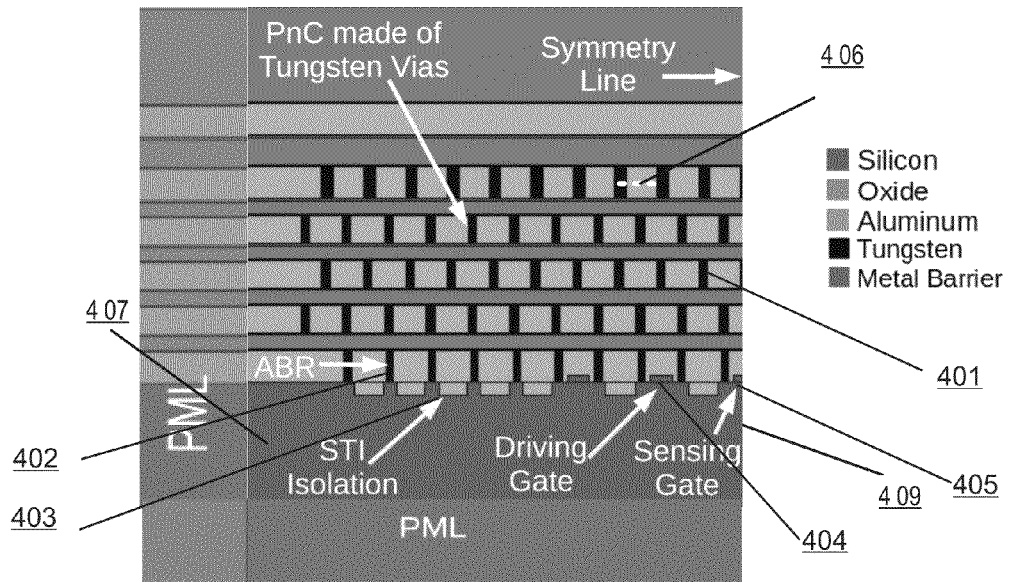
FIG. 9A shows an example acoustic bandgap structure, according to the principles described herein.

FIG. 9A shows a portion of an example CMOS resonant body transistor that includes a phononic crystal lattice. The device includes vias 401, ABRs 402, shallow trench isolators (STIs) 403, driving gates 404, and sensing gates 405, according to the principles herein. The example structure also includes PMLs, perfectly matched layers that emulate a long-extending wafer. In some example implementations, the resonant cavity 409 may manifest itself as a defect in the otherwise periodic phononic crystal constructed using lower acoustic impedance dielectric, and higher acoustic impedance vias and layers. For example, the resonant cavity may be formed by the omission of vias and dielectrics in a portion of the structure above the substrate. In some example implementations, the resonance cavity may include MOSFETs polysilicon or metal gates, STIs and/or tungsten front-end-of-line (FEOL) contacts. For example, the resonant cavity may be formed from stacked field effect transistor (FET) gates that are close together, and the RBT resonance frequency may be determined by the FETs separation as well as their gate length.

For example, in FIG. 9A, the example resonance body transistor (RBT) structure includes five FET gates. FIG. 9A shows half the structure; the other half can be extrapolated through mirror symmetry reflection. The middle FET may be an n-FET and may be used for sensing the cavity vibrations. The FETs immediately to the left and to the right of the middle FET may be p-FETs and may be used to drive the cavity. For example, the resonance cavity may be driven by the electrostatic forces resulting from applying small signal AC voltage to some of the FET gates that form the cavity. In some example implementations, the acoustic vibrations may be sensed as a modulation in one of the FETs current. In some example implementations, more gates may be added next to the driving gates to extend the acoustic resonant cavity. In some example implementations, ABRs may also be implemented by long rectangular (wall-like) contacts. The role of the ABRs is to confine the resonance mode in the plane of the substrate. The phononic crystals can provide high reflectivity in approximately a $2\pi$ solid angle (or a hemisphere) above the resonant cavity (disposed over the wafer 407).

Figure 9B:
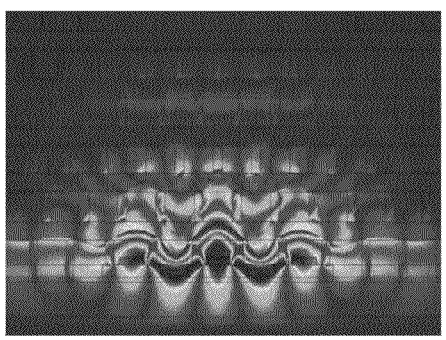
FIGS. 9B-9C show example FEM computation results of shear modes in an example resonant cavity, according to the principles described herein.
Figure 9C:
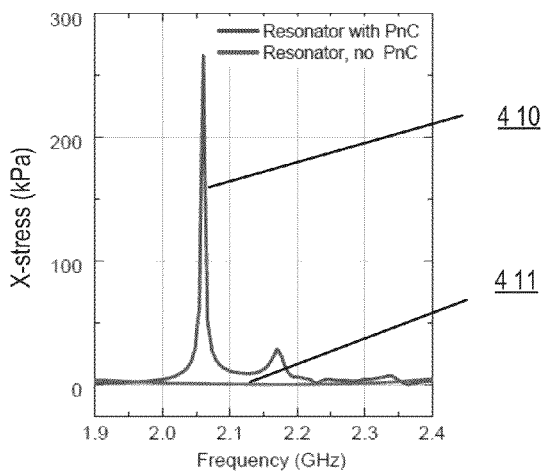

FIGS. 9B-9C show example Finite Element Method (FEM) simulation results of shear modes excited and trapped within a phononic crystal resonant, according to the principles described herein. FIG. 9B shows an example FEM computation of resonant modes in an acoustic resonant cavity coupled to a phononic crystal in a CMOS stack. The computation results show a vertical shear mode excited and confined within the resonant cavity. FIG. 9C shows example stress vs. frequency plot comparing the performance of the unreleased resonator before and after inclusion of phononic crystal lattice surrounding the resonator cavity. As shown in the example of FIG. 9C, the x-stress of the resonance cavity structure develops a peak 410 at the resonance frequency in the presence of a phononic crystal. By comparison, results 411 are obtained in the absence of a phononic crystal lattice. In some example implementations, other resonance modes such as, but not limited to, y-stress and xy-stresses may also be determined from FEM simulations. In other examples, an acoustic resonant mode, such as but not limited to longitudinal, flexural, shear, or Lame modes, may be excited by changing the location of drive and sense transducers while maintaining the resonance frequency within the phononic crystal bandgap.

Figure 10B:
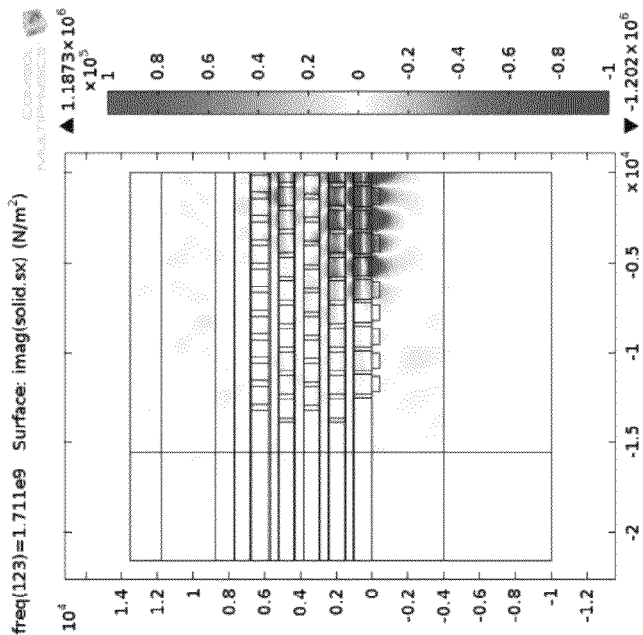
FIG. 10B shows example FEM computation results of a confined acoustic mode for an example resonant cavity, according to the principles described herein.
Figure 10A:
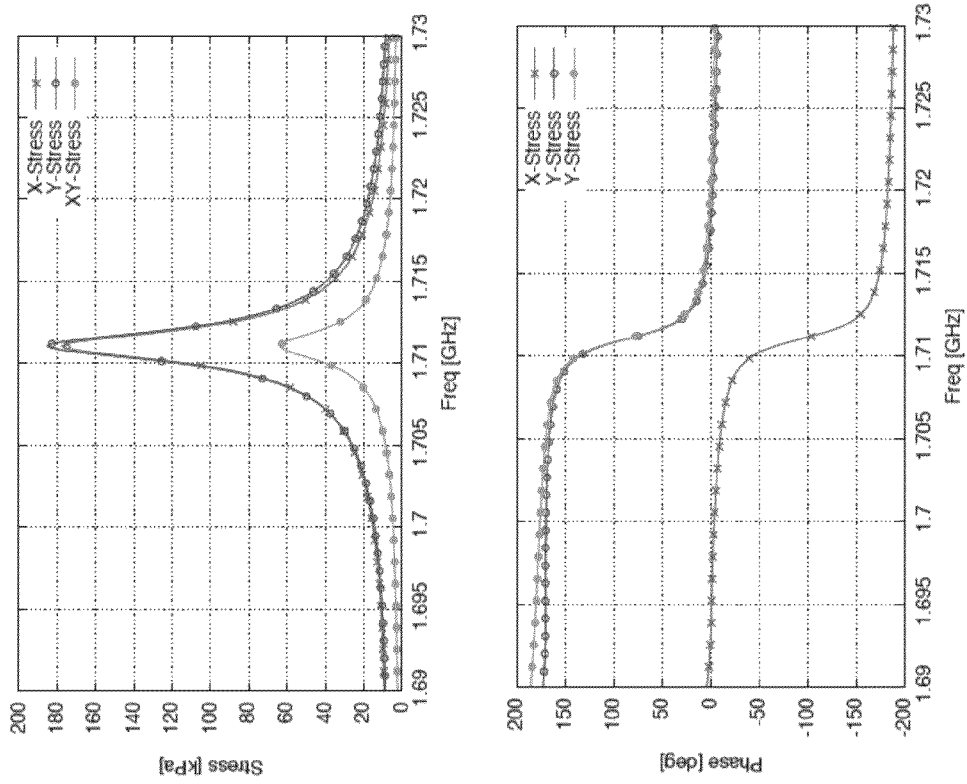
FIG. 10A shows example FEM computation results of stresses at the sensing gate of an example resonator, according to the principles described herein.

FIG. 10A shows example computation results depicting X, Y and XY stresses at the sensing gate for 1 MPa of stress applied uniformly at the driving gate of the resonator. FIG. 10A shows example finite element method computation showing X-direction stress in the example CMOS cavity resonator of FIG. 9A. The mode is mostly confined in the resonance cavity.

For example, FIG. 10A show results of example FEM computations for average x, y and xy-stresses of the RBT structure whose dimensions are listed in Table 2. In some example implementations, the optimization of the RBT structure in FIG. 9A may be performed by sweeping the different geometrical parameters of the structure and searching for those parameters that coincide with the highest stress at the sensing gate. For example, gate length, gates separation and ABR spacing may be varied to determine the optimal values that result in the highest stress. In some example implementations, factors such as, but not limited to, the irregular geometry of the cavity, the tungsten contacts to the gates, the different width of upper metal vias may force the phononic crystal characteristics to deviate from those predicted by the idealistic unit cell of FIG. 11A. To compensate for such deviations, in some example implementations, the phononic crystal periodicity itself may be optimized as part of the overall RBT structure. Table 2 provides structure parameters of an example optimized CMOS RBT. FIG. 10A shows the resulting x and y stresses at the sensing gates from applying 1 MPa of stress at the driving gate, as both of them contribute to the sensing mechanism. The x-stress distribution at resonance over the RBT is shown in FIG. 10B, showing a resonance mode that is confined within the resonance cavity. In these example implementations, the optimized RBT has a Q factor of 917 and an x-stress of 180 kPa in the sensing channel.

TABLE 2

| Optimized device configuration dimensions | |
|---|---|
| FET gate length | 700 nm |
| FETs Active Area separation (STI) | 940 nm |
| Phononic crystal via separation | 1050 nm |
| ABR STI length | 900 nm |
| ABR Active Area length | 420 |

Figure 11B:
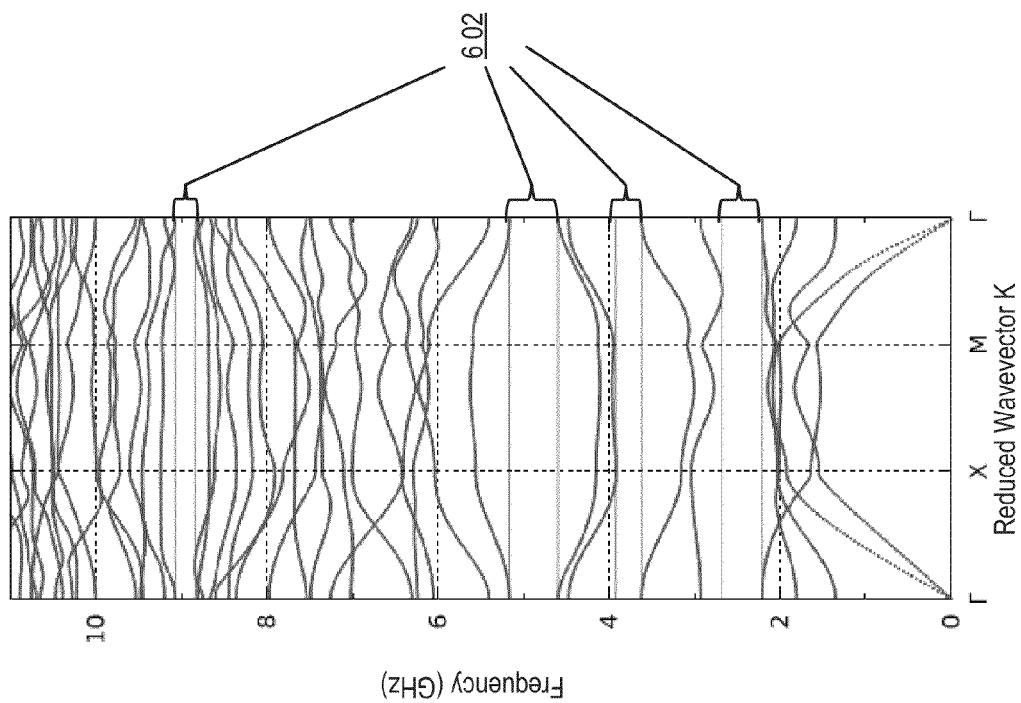
FIGS. 11A-11B show a cross-section (11A) of an example acoustic bandgap structure that includes an example phononic crystal lattice, an acoustic resonant cavity and a substrate and (11B) a phononic band diagram computed for the example phononic crystal lattice, according to the principles described herein.
Figure 11A:
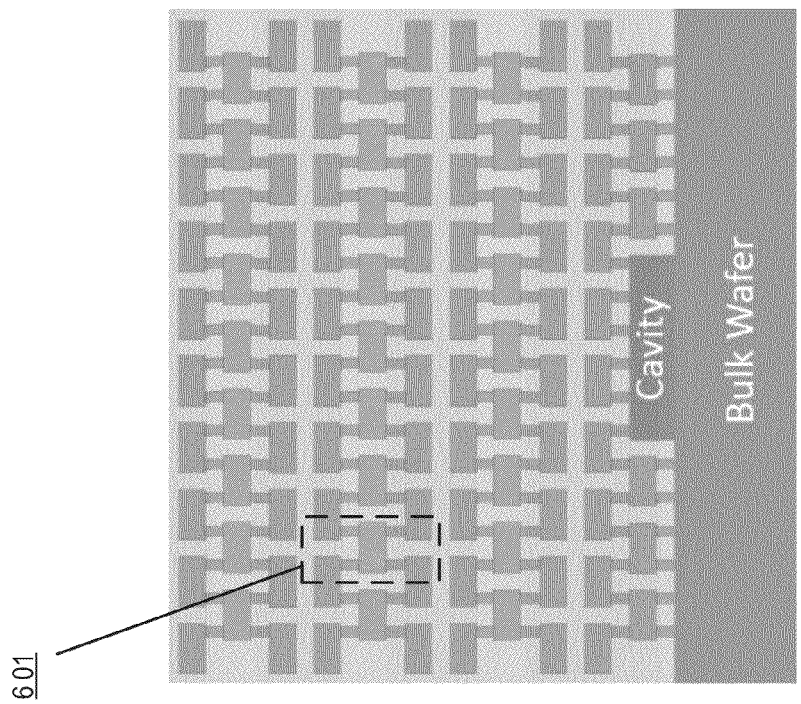

FIG. 11A shows an example acoustic bandgap device including a phononic crystal lattice of "connected H" shaped unit cells 601. The phononic crystal includes copper vias and metal routings as the higher acoustic impedance structures, and oxides/inter-metal dielectrics with low dielectric constant as the lower acoustic impedance material. In other examples, the metal routings and vias can be formed from any other material described herein, including copper, aluminum and tungsten. FIG. 11B shows an example phononic band structure computed for the example phononic crystal lattice shown in FIG. 11A. The phononic band diagram shows four bandgaps 602, appearing at center frequencies of about 2.5 GHz, about 3.75 GHz, about 5 GHz and about 9 GHz.

Figure 12B:
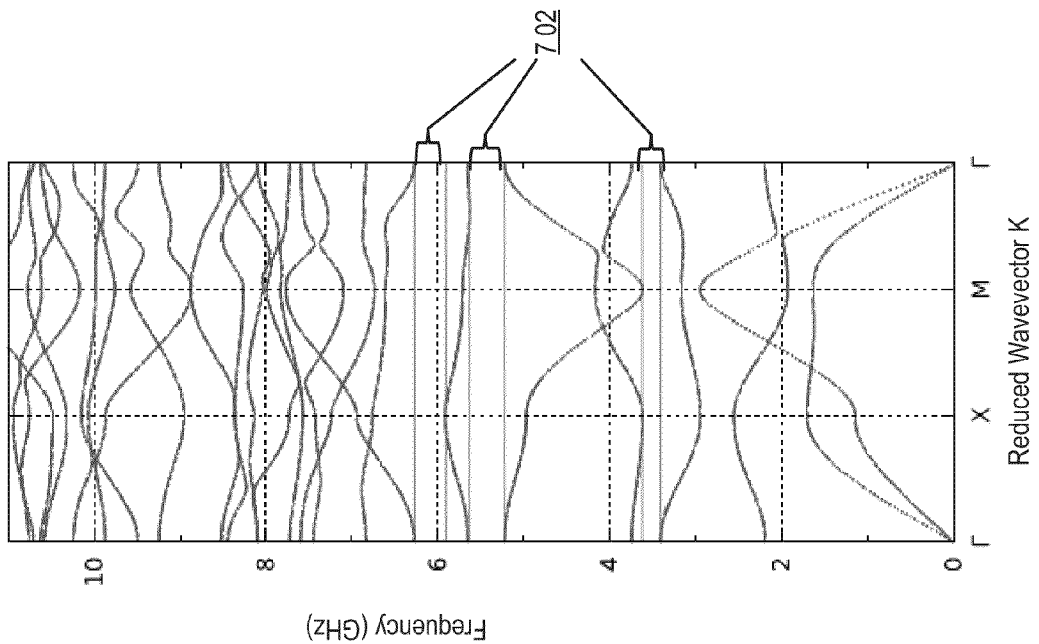
FIGS. 12A-12B show a cross-section (12A) of another example acoustic bandgap structure that includes an example phononic crystal lattice, an acoustic resonant cavity and a substrate and (12B) a phononic band diagram computed for the example phononic crystal lattice, according to the principles described herein.
Figure 12A:
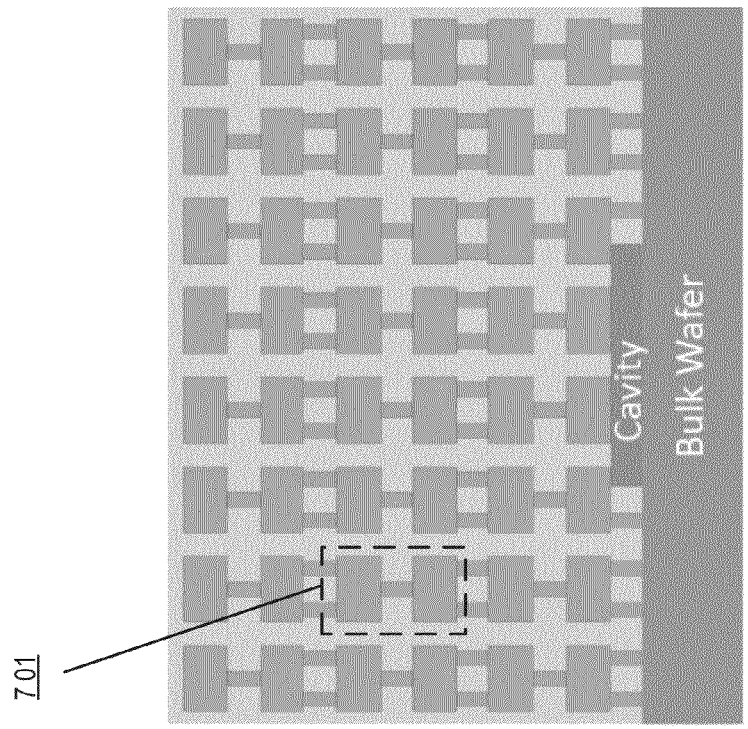

FIG. 12A shows an example acoustic bandgap device including a phononic crystal lattice of "connected I" shaped unit cells 701. The phononic crystal includes copper vias and metal routings as the higher acoustic impedance structures, and oxides/inter-metal dielectrics with low dielectric constant as the lower acoustic impedance material. In other examples, the metal routings and vias can be formed from any other material described herein, including copper, aluminum and tungsten. FIG. 12B shows an example band structure computed for the example phononic crystal lattice shown in FIG. 12A. The phononic band diagram shows three bandgaps 702, appearing at about 3.75 GHz, about 5.75 GHz, and about 6 GHz.

Figure 13B:
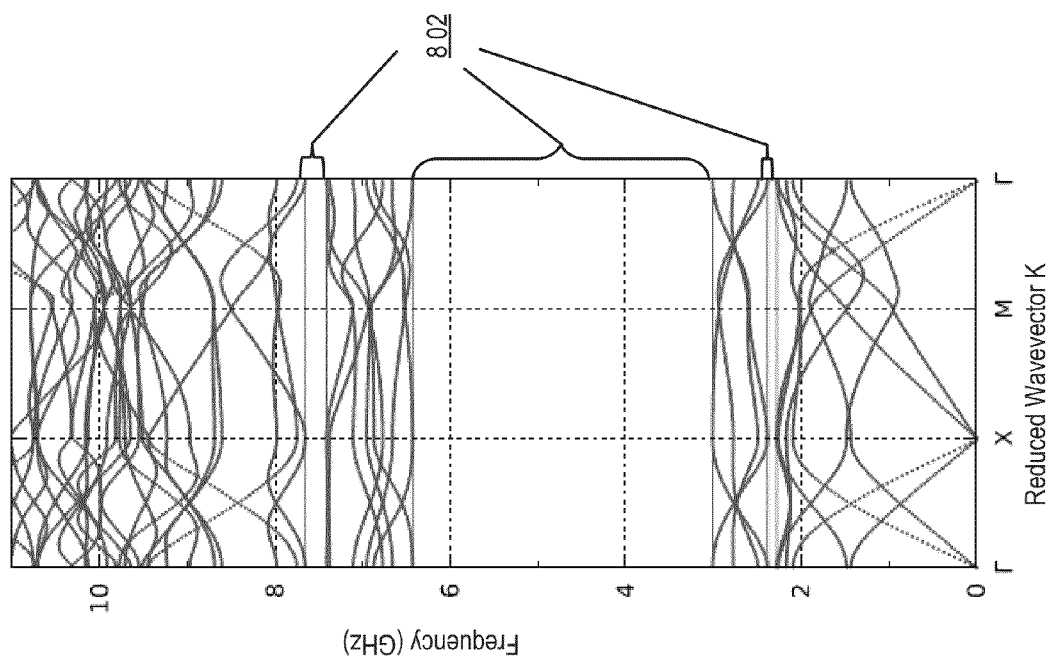
FIGS. 13A-13B show a cross-section (13A) of another example acoustic bandgap structure that includes an example phononic crystal lattice, an acoustic resonant cavity and a substrate and (13B) a phononic band diagram computed for the example phononic crystal lattice, according to the principles described herein.
Figure 13A:
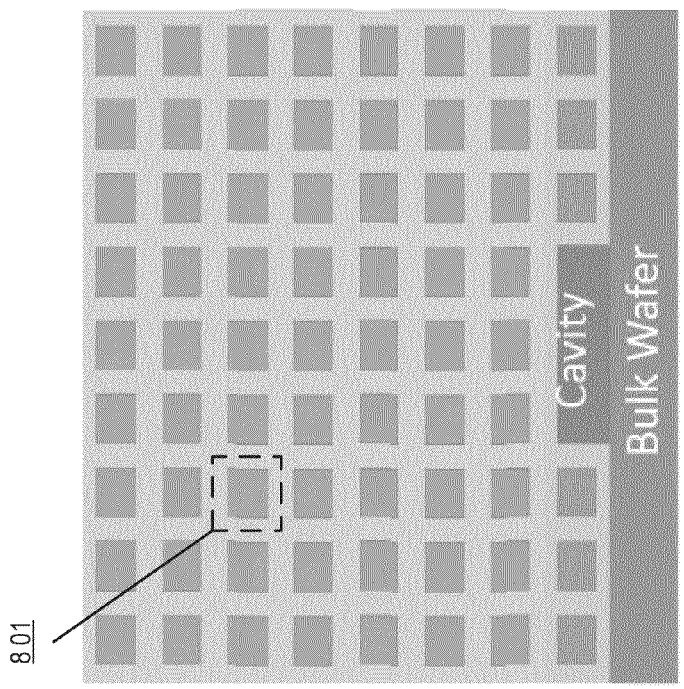

FIG. 13A shows an example acoustic bandgap device including a phononic crystal lattice of "square" shaped unit cells 801. The phononic crystal includes copper vias and metal routings as the higher acoustic impedance structures, and oxides/inter-metal dielectrics with low dielectric constant as the lower acoustic impedance material. In other examples, the metal routings and vias can be formed from any other material described herein, including copper, aluminum and tungsten. FIG. 13B shows an example band structure of the example phononic crystal shown in FIG. 13A. The phononic band diagram shows three bandgaps 802, appearing at about 5 GHz and two smaller ones about 2.25 GHz and about 7.5 GHz.

Figure 14A:
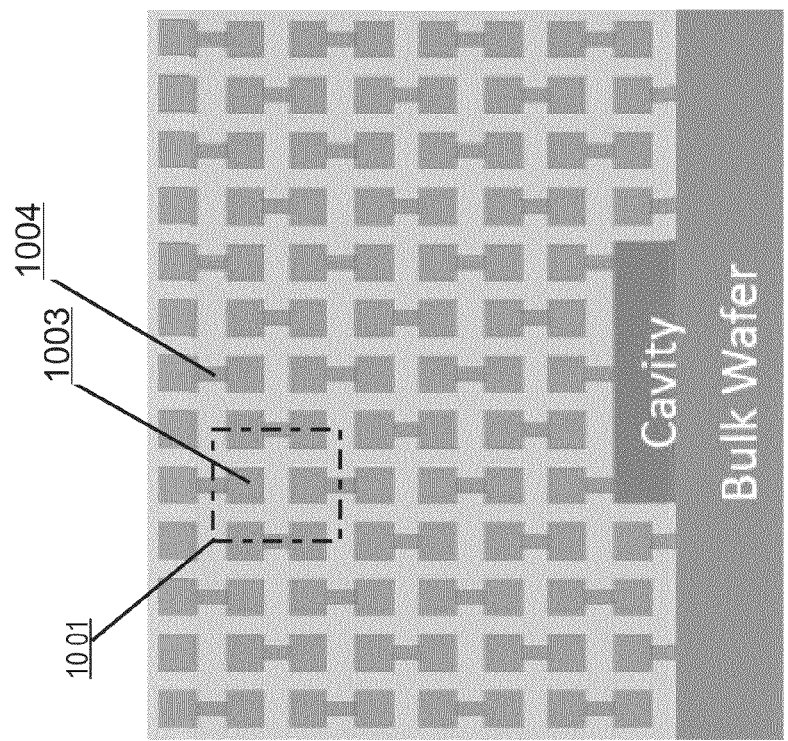
FIGS. 14A-14B show a cross-section (14A) of another example acoustic bandgap structure that includes an example phononic crystal lattice, an acoustic resonant cavity and a substrate and (15B) a phononic band diagram computed for the example phononic crystal lattice, according to the principles described herein.
Figure 14B:
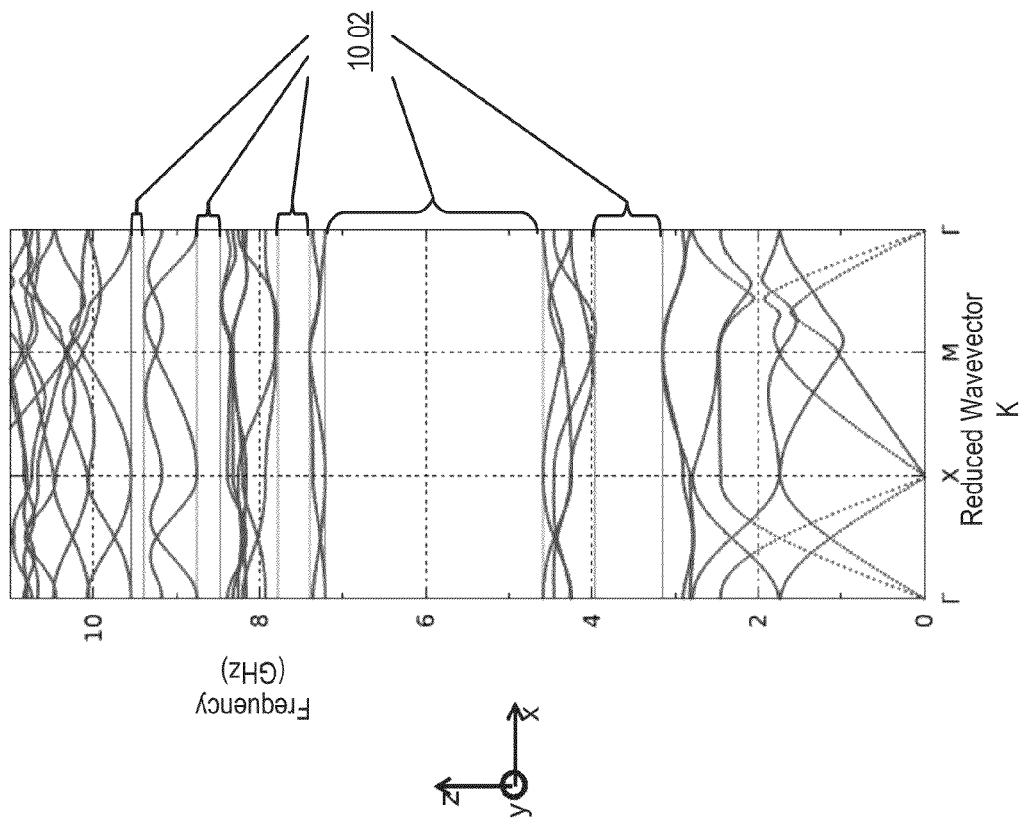

FIG. 14A shows an example acoustic bandgap device including a phononic crystal lattice of "staggered I" shaped unit cells 1001. The phononic crystal includes copper vias (1004) and metal routings as the higher acoustic impedance structures, and oxides/inter-metal dielectrics with low dielectric constant as the lower acoustic impedance material. In other examples, the metal routings and vias can be formed from any other material described herein, including copper, aluminum and tungsten. FIG. 14B shows an example band structure of the phononic crystal shown in FIG. 14A. The phononic band diagram shows five bandgaps 1002, appearing at about 3.5 GHz, about 6 GHz, about 7.75 GHz, about 8.5 GHz and about 9.5 GHz.

Figure 15A:
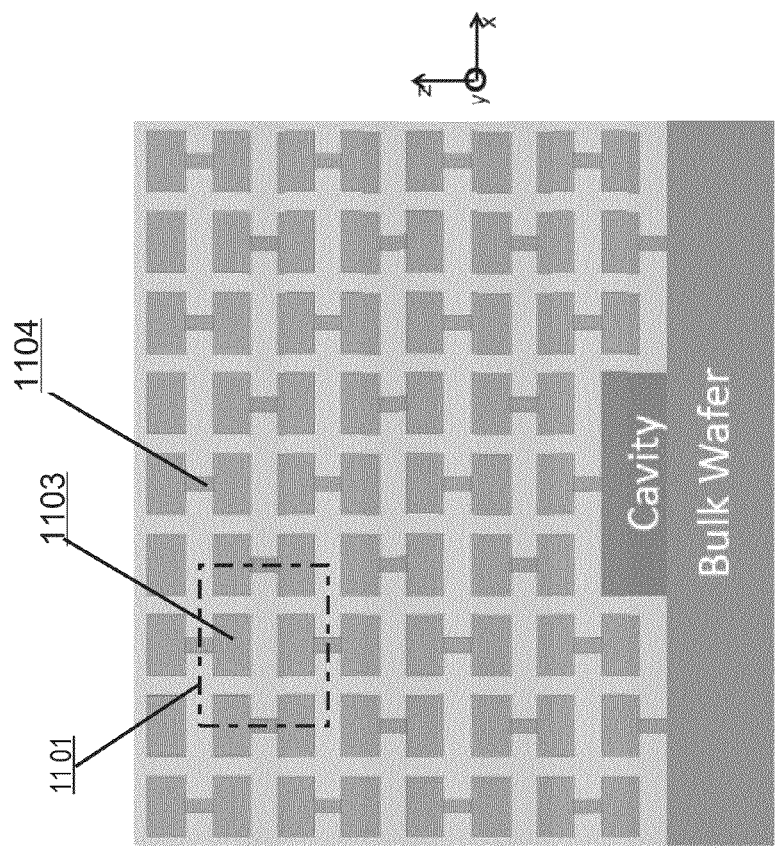
FIGS. 15A-15B show a cross-section (15A) of another example acoustic bandgap structure that includes an example phononic crystal lattice, an acoustic resonant cavity and a substrate and (15B) a phononic band diagram computed for the example phononic crystal lattice, according to the principles described herein.
Figure 15B:
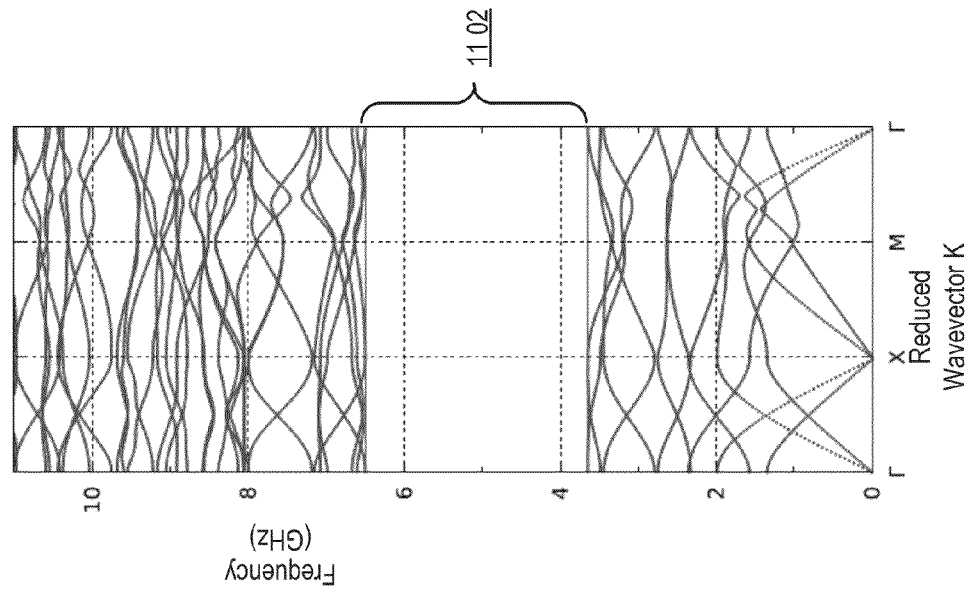

FIG. 15A shows another example acoustic bandgap device including a phononic crystal lattice of "staggered I" shaped unit cells 1101. The phononic crystal includes copper vias (1104), metal routings and oxides/inter-metal dielectrics with low dielectric constant. In other examples, the metal routings and vias can be formed from any other material described herein, including copper, aluminum and tungsten. FIG. 15B shows an example band structure of the phononic crystal shown in FIG. 15A. The phononic band diagram shows a single bandgap 1102, appearing at about 5 GHz with bandwidth of about 2.5 GHz. The difference between FIG. 14A and FIG. 15A lies in the dimensions of the high acoustic impedance structure. The portion 1103 of the higher acoustic impedance structure shown in FIG. 15A is wider than the portion 1003 of the higher acoustic impedance structure shown in FIG. 14A (in the defined x-direction). The vias 1003 and 1103 are of roughly similar widths in these two examples. Based on a comparison of FIGS. 14B and 15B, the difference in relative dimension between the higher acoustic impedance structures is shown to give rise to differences in phononic band structure, namely, differing numbers of bandgaps and differing widths of the bandgaps. Based on this comparison, it is shown that the phononic band diagram for an acoustic bandgap device may be tuned based on controlling the dimensions of certain features of the higher acoustic impedance structure in a unit cell (and similarly for the lower acoustic impedance materials).

As described above, the 2D patterns available for implementing the phononic crystal in a semiconductor fabrication tool may be limited by the attainable features that can be fabricated in a semiconductor fabrication tool. For example, FIG. 11A is a rectangular phononic crystal lattice formed from a unit cell 601 with a "connected H" shape including Cu/Al/W for vias and metal routings, and oxide/low-dielectric material for inter-metal dielectrics. In this example implementation, the resulting dispersion relation has four phononic bandgaps 602 that follow from the impedance mismatch between the vias and metals and the inter-metal dielectrics. These four phononic bandgaps 602 would facilitate the confinement of resonance modes in the cavity at frequencies in these frequency ranges. Similarly, FIGS. 12A-13B depict example phononic crystal lattice structures formed from periodic arrangements of "connected H" and "square"-shaped unit cells, respectively, and their corresponding dispersion relations. Each band diagram exhibits one or more phononic bandgaps due to the mismatch of acoustic impedances between the vias/metals and the dielectrics.

FIGS. 14A-14B and 15A-15B shows example phononic crystal structures that are both formed from "staggered I" unit cells. However, as shown and described relative to FIGS. 14A-14B and 15A-15B, each unit cell is formed with different dimensions for portions of the higher acoustic impedance structures. In some example implementations, for the phononic crystals formed from smaller horizontal bar structures (1003), the band structure has multiple bandgaps 1002 with the largest one centered around 6 GHz. For the phononic crystals formed from wider horizontal bar structures (1103), in the example implementation, the location of the largest bandgap is lowered, being centered at around 5 GHz. Also, as a result of the change in dimensions of the higher acoustic impedance structures in a unit cell, the smaller bandgaps in FIG. 14B are subsumed in the band structure and disappear, resulting in a single wide bandgap in FIG. 15B. Accordingly, it is shown in this example that a phononic band structure can be tuned by controlling the dimensions of features in the unit cell. In this example, configuring a larger dimension of the higher acoustic impedance horizontal bar lowers the frequency location of the largest bandgap. In a first example acoustic bandgap device, the phononic crystal can be fabricated with a horizontal bar in a unit cell having a first width in the x-direction that generates an acoustic bandgap device having a first bandgap. For another example acoustic bandgap device, the example longitudinal bar can be fabricated with a second width in the x-direction larger than the first can have a second bandgap that is wider than the first bandgap.

FIG. 16A shows an example of the reduced order small signal Butterworth-Van-Dyke (BVD) model that can be used to model mechanical resonances in the example resonator of the CMOS RBT of FIG. 9A, according to the principles described herein. The model components of the circuit simulation include resistors r and R, capacitors C, voltages v, inductors L, and current I. In some example implementations, accurate description of the mechanical resonance calls for models that take into account the strong coupling between the electrical and mechanical domains in a RBT.

The electromechanical transconductance $g_m$ for the example RBT can be computed based on a circuit model, using the expression:

$$g_m(s) = \frac{g_\alpha}{s^2 L_m C_m + s R_m C_m + 1} + sC_f + 1/r_f$$

The mechanical model parameters are $R_m$, $L_m$ and $C_m$, as well as the transconductance $g_\alpha$. The expression for electromechanical transconductance $g_m$ can be used to model the performance of the example device. Using the x and y stress from the FEM simulation results of FIG. 10A, the electromechanical transconductance $g_m$ can be evaluated. FIG. 16B shows the results for a DC bias current of 100 μA and a driving gate DC bias of 1.8V, obtained using COMSOL Multiphysics® (available from COMSOL, Inc., Burlington, Mass.). The mechanical model parameters $R_m$, $L_m$ and $C_m$, as well as the transconductance $g_\alpha$, can be found from data fitting of the simulation results of FIG. 16B. Feed-through is not included in these example results, and other methods can be used to find $C_f$ and $r_f$.

In an example implementation, a design flow for designing and configuring an example device can include designing an example RBT structure and deriving an estimation of its performance based on a FEM simulation. To use the example design for an actual circuit design, a model for $g_m$ can be used, such as but not limited to the form given above, to model the performance of the example device. The expression for $g_m$ provides a representation of an equivalent circuit used for simulation with circuits.

In an example implementation, an acoustic bandgap device can be fabricated using a standard CMOS process, based on material components and feature dimensions computed using the technology process design kit (PDK). In this example, the PDKs can be used to provide details about transistor model parameters, as well as parasitics information. In an example, Commercial Electronic Design Automation (EDA) tools can be used to extract the feed-through parameters of the RBT. Table 3 lists example fitted small signal parameters for an example computation based on the device of FIG. 9A.

TABLE 3 example fitted small signal parameters

| | |
|---|---|
| $g_\alpha$ | 60 pS |
| R | 303.8 kΩ |
| L | 31.96 μH |
| C | 270.7 aF |

As a non-limiting example, the operation and performance of a RBT can be determined based on its mechanical structure and geometrical configuration. Standard CMOS technologies, and other semiconductor fabrication tools described herein, impose many constraints on the achievable structure for an example RBT. The configuration of the example RBT can vary based on the semiconductor fabrication tools used for fabrication.

Using the example systems, methods, and apparatus according to the principles herein, a design for an example acoustic bandgap device can be determined for a given semiconductor fabrication technology, while complying with the complicated DRC and manufacturing constraints for the given semiconductor fabrication tool.

Figure 17:
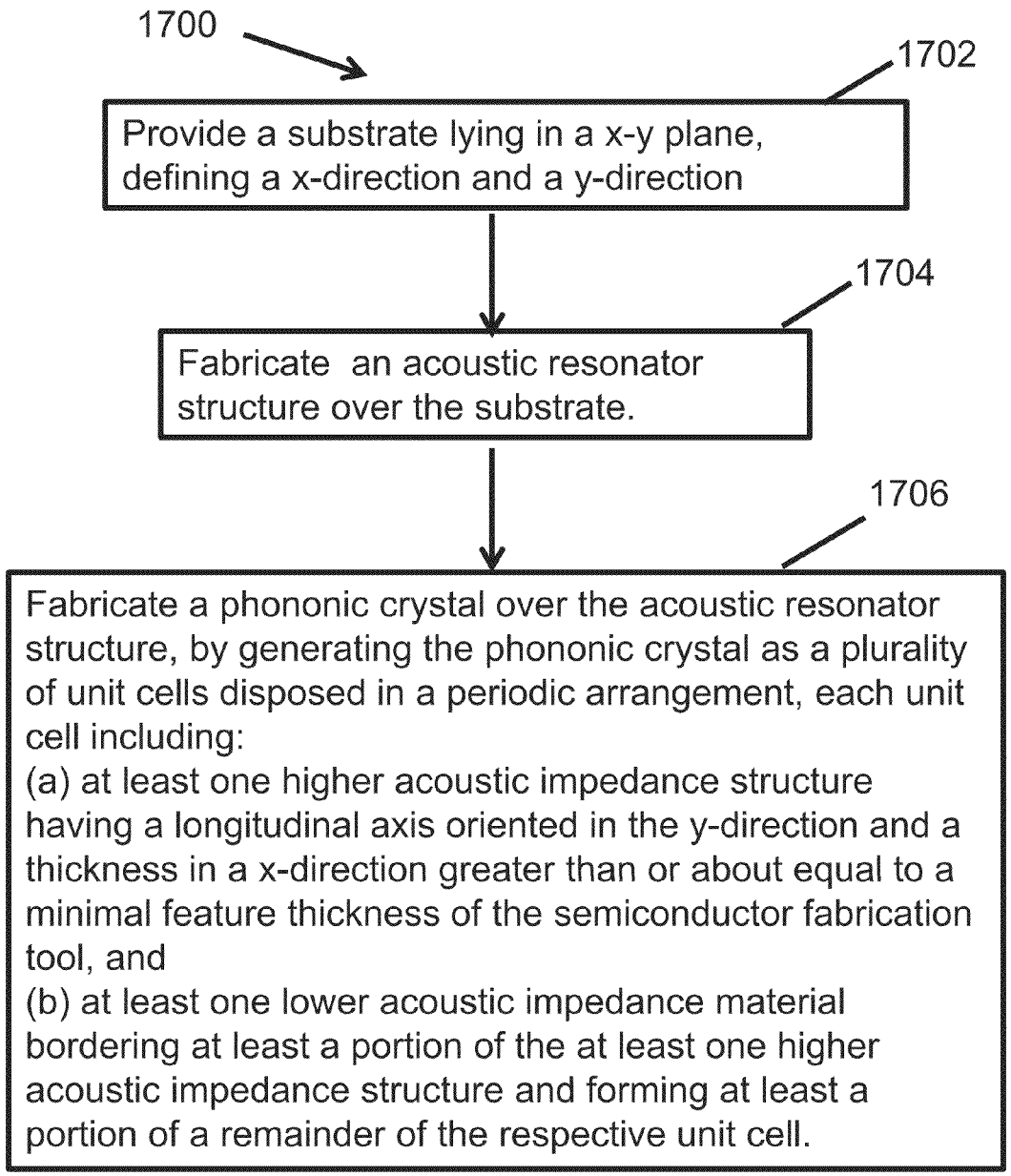
FIG. 17 shows procedures of an example method, according to the principles described herein.

Example methods are provided for fabricating example acoustic bandgap devices according to the principles described herein, using a semiconductor fabrication tool. The semiconductor fabrication tool has a minimal feature thickness and an allowable via width based on a design rule check of the semiconductor fabrication tool. As shown in FIG. 17, an example method 1700 can include providing (1702) a substrate lying in an x-y plane and defining an x-direction and a y-direction, fabricating (1704) an acoustic resonant cavity over the substrate, and fabricating (1706) a phononic crystal over the acoustic resonant cavity by generating the phononic crystal as a plurality of unit cells disposed in a periodic arrangement. Each unit cell can include: (a) at least one higher acoustic impedance structure having a longitudinal axis oriented in the y-direction and a thickness in an x-direction greater than or about equal to a minimal feature thickness of the semiconductor fabrication tool, and (b) at least one lower acoustic impedance material bordering at least a portion of the at least one higher acoustic impedance structure and forming at least a portion of a remainder of the respective unit cell. The at least one higher acoustic impedance structure can include at least one via structure, each via structure having a width in the x-direction about equal to an allowable via width of the semiconductor fabrication tool, and/or at least one longitudinal bar, each longitudinal bar having a width in the x-direction greater than the width of the at least one via structure. The ratio of the acoustic impedance of the higher acoustic impedance structure to the acoustic impedance of the lower acoustic impedance material is greater than 1.0. The phononic crystal suppresses phononic excitations in at least one frequency band, thereby providing at least one phononic bandgap.

An example system, method or apparatus herein can be used to provide a device configuration module to generate a design for an example acoustic bandgap device according to the principles described herein. Such an example device configuration module can include a processor and a memory storing processor executable instructions. Execution of the processor executable instructions causes the example device configuration module to perform any method described herein to determine an acoustic bandgap device configuration. Execution of such an example method can include determining a configuration of a unit cell for a candidate phononic crystal lattice to be fabricated, based on the desired phononic bandgap properties of an example acoustic bandgap device. FEM simulations and computation of equivalent circuit representations, e.g., by computing $g_m$, can be used to assess the performance of an example acoustic bandgap device based on the candidate phononic crystal lattice. As a non-limiting example, performance measures to be optimized for an example RBT include the Quality factor, peak transconductance and spurious modes. In an example, a device configuration module can be configured to execute processor-executable instructions to suggest variations in a design of a candidate phononic crystal lattice to generate an acoustic bandgap device, based on the performance parameters computed from previous runs, to evaluate the performance characteristics of a candidate design, converging towards an optimal structure with each iteration. Instructions to be executed by a semiconductor fabrication can be generated based on the generated configuration of the acoustic bandgap device using the example device configuration module. As a non-limiting example, an output of the device configuration module can be instructions that can be used by a computer aided design (CAD) tool, such as but not limited to the tool provided by Cadence Design Systems, Inc., San Jose, Calif. For example, based on the output from the device configuration module, a CAD tool can be implemented to determine parameters defining the layer structure of each layer of at least one of the phononic crystal structure and the resonant cavity, for use by the semiconductor fabrication tool to generate the example acoustic bandgap device. In an example implementation, based on these determined parameters, and the instructions for the layering sequence in the fabrication, a semiconductor fabrication tool can be implemented to fabricate an example the phononic crystal lattice, or an example acoustic bandgap device including the example phononic crystal lattice.

According to the principles herein, at least one non-transitory computer-readable medium is provided having code representing processor-executable instructions encoded thereon, the processor-executable instructions including instructions that, when executed by one or more processing units, perform any example method described herein, including any method for generating a design of a candidate phononic crystal lattice, or an example acoustic bandgap device including the example phononic crystal lattice.

According to the principles herein, at least one non-transitory computer-readable medium is provided having code representing processor-executable instructions encoded thereon, the processor-executable instructions including instructions that, when executed by one or more processing units, perform any example method described herein, including any instructions performed using a device configuration module according to the principles described herein.

Figure 18:
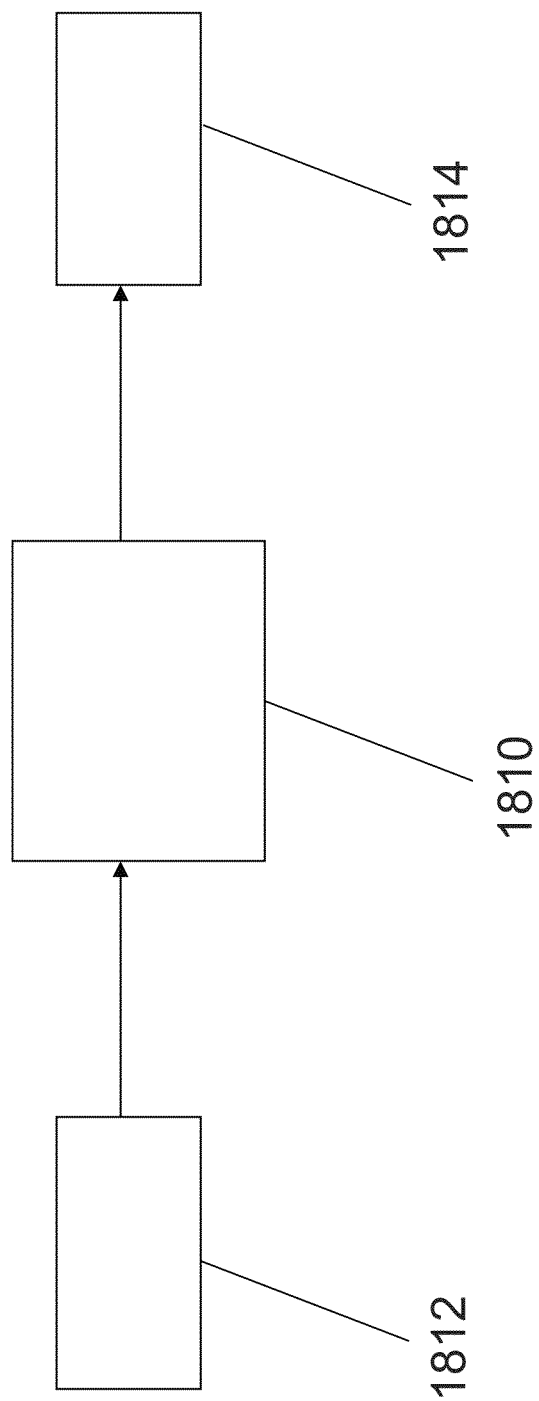
FIG. 18 shows a block diagram of an example device configuration system, according to the principles described herein.

FIG. 18 shows a block diagram of an example device configuration system 1810 that generates received input information 1812 and generated an output 1814 of a device configuration module, as described herein. In particular, the device configuration system 1810 can be implemented to execute instructions associated with any of the example methods described herein. In some examples, the device configuration system 1810 provides the output 1814 by storing it to a data storage device (e.g., in a database, a server, or other memory), rendering it on a display (e.g., in a user interface generated by a software application program or App), or rendering it on a print medium (e.g., paper).

Figure 19:
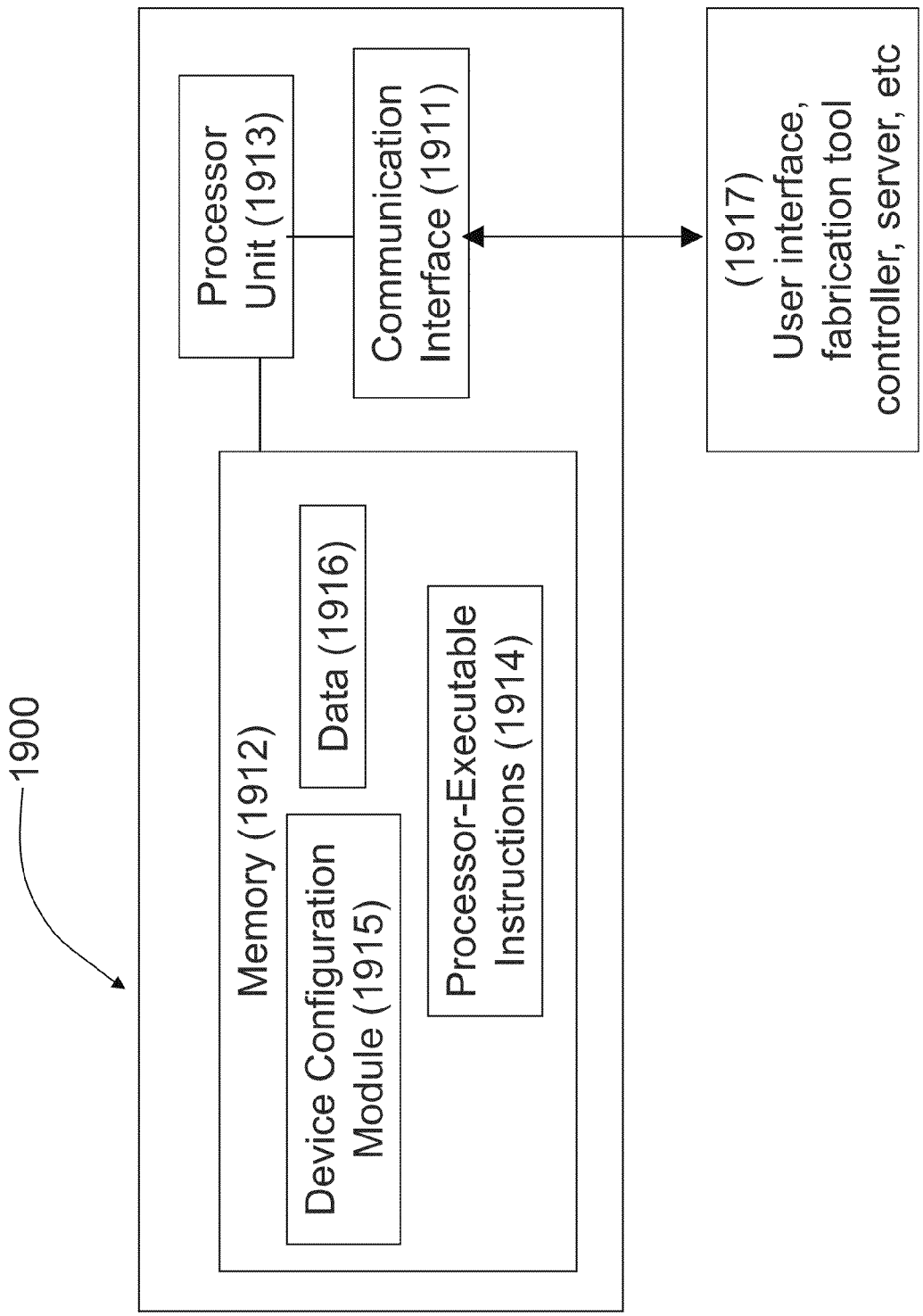
FIG. 19 shows a block diagram of an example system, according to the principles described herein.

FIG. 19 shows a block diagram of an example system including a device configuration module, according to the systems and methods described herein. A non-limiting example of the system 1900 according to the principles described herein is illustrated in FIG. 19. The system 1900 includes at least one communication interface 1911, at least one memory 1912, and at least one processing unit 1913. The at least one processing unit 1913 is communicatively coupled to the at least one communication interface 1911 and the at least one memory 1912. The at least one memory 1912 is configured to store processor-executable instructions 1914 and a device configuration module 1915. As described in greater detail herein, the device configuration module 1915 can be applied to determine, based on data 1916 representative of the DRC requirements of a semiconductor fabrication tool, an output of the device configuration module, as described herein. In a non-limiting example, the at least one processing unit 1913 executes the processor-executable instructions 1914 stored in the memory 1912 at least to provide the iterative computation described hereinabove. The at least one processing unit 1913 also executes processor-executable instructions 1914 to control the memory 1912 to store, or to control the communication interface 1911 to transmit 1917, an output of the device configuration module, as described herein, to, e.g., a user interface, a controller for a semiconductor fabrication tool, a database, or a server.

Figure 20:
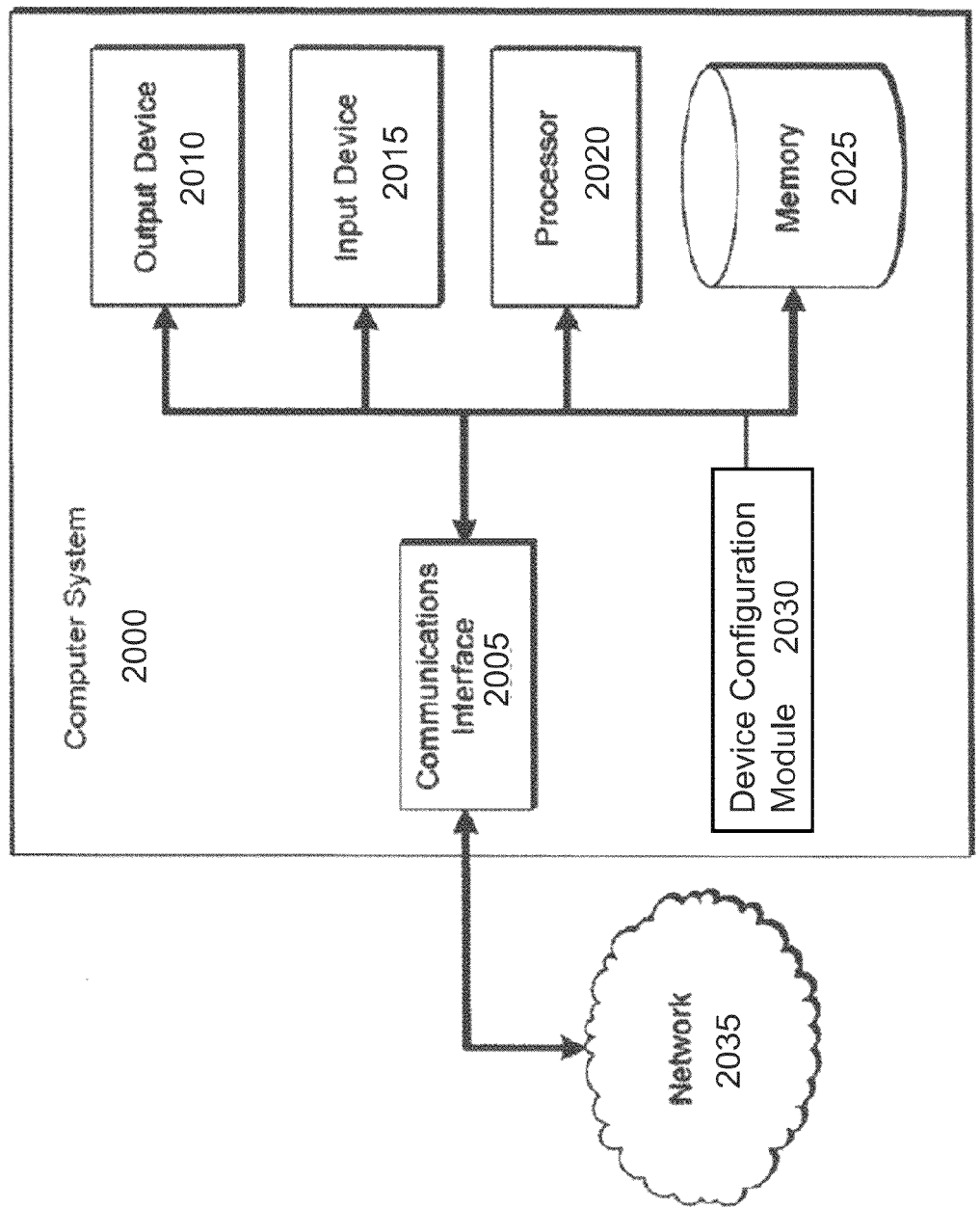
FIG. 20 shows the architecture of an example computer system, according to the principles described herein.

FIG. 20 shows an example architecture of an illustrative computer system 2000 that can be employed to implement any of the systems and methods described herein. The computer system 2000 of FIG. 20 includes one or more processors 2020 communicatively coupled to memory 2025, one or more communications interfaces 2005, and one or more output devices 2010 (e.g., one or more display units) and one or more input devices 2015.

In the computer system 2000 of FIG. 20, the memory 2025 may comprise any computer-readable storage media, and may store computer instructions such as processor-executable instructions for implementing the various functionalities described herein for respective systems, as well as any data relating thereto, generated thereby, or received via the communications interface(s) or input device(s). The processor(s) 2020 shown in FIG. 20 may be used to execute instructions stored in the memory 2025 and, in so doing, also may read from or write to the memory various information processed and or generated pursuant to execution of the instructions.

The example computer system 2000 also includes a device configuration module 2030. Device configuration module comprises processor-executable instructions for performing any of the methods described herein to provide, for example, an output of the device configuration module, as described herein. Processor 2020 can be used to execute the processor-executable instructions in connection with device configuration module 2030.

The processor 2020 of the computer system 2000 shown in FIG. 20 also may be communicatively coupled to or control the communications interface(s) 2005 to transmit or receive various information pursuant to execution of instructions. For example, the communications interface(s) 2005 may be coupled to a wired or wireless network, bus, or other communication means and may therefore allow the computer system 2000 to transmit information to and/or receive information from other devices (e.g., other computer systems). Communication interface(s) 2005 also may be in communication with an external network 2035. In some implementations, the communications interface(s) may be configured (e.g., via various hardware components or software components) to provide a website or applications program (an App) on an electronic device as an access portal to at least some aspects of the computer system 2000. Non-limiting examples of such electronic devices are tablets, slates, smartphones, electronic readers, or other similar electronic electronic devices.

The output devices 2010 of the computer system 2000 shown in FIG. 20 may be provided, for example, to allow various information to be viewed or otherwise perceived in connection with execution of the instructions. The input device(s) 2015 may be provided, for example, to allow a user to make manual adjustments, make selections, enter data or various other information, or interact in any of a variety of manners with the processor during execution of the instructions of the device configuration module.

In an example, some CMOS radio-frequency (RF) technologies can include fabrication of a metal-insulator-metal (MIM) capacitor for high frequency operation as an integral part of the back-end-of-line (BEOL) stack. These MIM capacitors can be used to drive and/or sense a resonant cavity defined by a phononic crystal and accompanying acoustic bandgap device. Either may be implemented in the BEOL stack.

As described for any example herein, the configuration of the acoustic resonators is not restricted to a standard CMOS process, and can be utilized in any commercial process to create integrated circuitry (IC) circuits where a minimal or no packaging solution for resonators is required.

In an example, many fabrication processes use tungsten or copper as the material choice for metals and vias. However, this disclosure is not limited to these metals. Similarly, various types of dielectrics can be used to isolate metal routing between adjacent devices/layers, such as but not limited to SiCOH, PSG and $SiO_2$. In an example, the resulting high-impedance metal paired with low-impedance dielectric combinations can be effectively used in the creation of example phononic crystals to form an acoustic cavity. ABRs may be included in acoustic bandgap structure proximate to the resonant cavity.

In any example, the vias may be formed between adjacent metal layers and/or may be fabricated to couple the metal routing to the bulk of the device instead. In this example, the selection of the specific material combination available in integrated circuits for the formation of vias and metal routing surrounded by dielectric in the front-end-of-line (FEOL) and/or the BEOL.

According to the example systems, methods, devices and apparatus described herein, the placement of vias and/or metals (in e.g., horizontal bar) with respect to the dielectric or in general the configuration of the phononic crystal structures is not restricted to the examples of unit cells described herein. A phononic crystal lattice may be constructed in any number of ways by modifying the placement of the higher acoustic impedance materials, e.g., the vias and/or the metals (in e.g., horizontal bar) with respect to each other to generate unique unit cells.

In some examples, the lower acoustic impedance material can be formed from a dielectric forming the background with metal holes and/or rods. In some examples, dielectric holes and/or rods can be formed in a 2D or 3D periodic metal lattice.

In some examples, the modern CMOS technologies may offer the option of having deep-trench (DT) capacitors, such as but not limited to for Dynamic Random Access Memories (DRAM). These example DTs can be filled with oxide or even have voids, which makes a high acoustic impedance mismatch with the substrate. These can have elliptical or circular cross sections. In another example, the DTs can be efficient holes in the substrate background to form example phononic crystal lattices.

In some examples, the phononic crystal lattices and/or the ABR can form a resonant cavity that is then used to design a resonator with any materials such as but not limited to Si, $SiO_2$, gate dielectric, poly-Si, stress liners, or silicide, available in the semiconductor fabrication technology, with any drive and/or sense mechanisms, such as but not limited to capacitive, piezoresistive, or thermal drive and/or sense mechanisms, to resonate in any type of mechanical (acoustic) mode including longitudinal, shear, or Lame, in the resonant cavity.

In an example, the example acoustic bandgap devices can be used in any application of RF MEMS resonators in wireless communications and/or microprocessor clocking. The major advantage of the RF MEMS resonators that include the example acoustic bandgap device according to the principles described herein is their high quality factor, Q, which can be Q=~10,000 at GHz frequencies compared to Q=~10 for some on-chip LC tanks. The RF MEMS resonators that include the example acoustic bandgap device herein also can show from four (4) to five (5) orders of magnitude reduction in footprint relative to on-chip LC tanks. Due to their capacity for CMOS integration, the RF MEMS resonators that include the example acoustic bandgap device herein can reduce the constraints on impedance matching networks, providing lower power consumption at the system level. These benefits can make RF MEMS resonators that include the example acoustic bandgap device components promising to be implemented in place of their electrical counterparts.

In an example aspect of wireless communication applications, the extreme frequency selectivity is beneficial. The high Q of MEMS resonators that include the example acoustic bandgap device herein can provide channel-select transceivers for sensor networks, or for ad-hoc configurable radios. In an example, Si MEMS resonators that include the example acoustic bandgap device herein also can be implemented for clocking applications. For example, a lot of power can be consumed distributing the clock signal from a low frequency external crystal over the entire processor. A distributed clock network that provides local clocking throughout the processor through an array of synchronized oscillators can be beneficial. This can be achieved with silicon-based low-power micromechanical oscillators, synchronized through mechanical interactions for low skew, low jitter clocking. The example acoustic bandgap devices herein can be included in MEMs oscillators to provide a solution in this example aspect of wireless communication application.

In an example, the integration of RF MEMS components that include the example acoustic bandgap devices described herein with circuits can be achieved in a single type of semiconductor fabrication tool. The traditional methods of through wire-bonding, which can cause parasitics, need not be performed. The RF MEMS resonators that include the example acoustic bandgap device can be formed as robust systems without added bulk. In an example, CMOS MEMS integration that includes the acoustic bandgap devices herein could be implemented though MEMS-first or MEMS-last methods. However, these methods may increase the complexity of fabrication and reduce robustness, and can cause thermal budget incompatibility and reduced performance. The example systems, apparatus, devices and methods described herein can be implemented to generate CMOS-integrated MEMS resonators using the example phononic crystals that integrate seamlessly with circuitry, with no additional steps, no post processing or special packaging. Acoustic Bragg reflectors (ABRs) can be included seamlessly with the acoustic resonant cavity according to the principles described herein. As a result, parasitic states, such as caused by, e.g., wire-bonding, can be avoided or reduced, and the power of the devices can be reduced. A system based on the example device according to the principles described herein consume smaller footprint, while still providing high quality factors that may be unachievable through circuit elements. The FEOL integration also may require no compromise on either MEMS side or CMOS side, providing on-chip building blocks for RF circuit designers.

An example acoustic bandgap device according to the principles herein does not require a released surface on the resonator in order to operate, such as can be required for surface-mount thin-film bulk acoustic resonator (FBAR) which is only a half-space 1D design. By comparison, an example acoustic bandgap device herein is at least 1D full-space, and in some example implementations can be extended to two dimensions (2D) or three dimensions (3D). this facilitates a larger range of energy isolation. Also, a surface-mount FBAR may require five (5) of its six (6) surfaces to be released in order to operate. By comparison, an example acoustic bandgap device herein can be fully encompassed in solid media and isolated from air, thereby eliminating the need for special packaging for device stability, and can be operated in extreme environments.

According to the principles herein, an example acoustic bandgap device, an example phononic crystal structure, and/or an example resonant cavity can be defined lithographically rather than by film thickness (as can be the case for surface-mount FBARs).

In an example, multiple unreleased resonators with different resonance frequencies can be fabricated side by side on the same die/wafer using a single set of masks. Accordingly, an example acoustic bandgap device according to the principles herein can be fabricated to include phononic crystals and multiple resonant cavities that resonate at differing resonance frequencies.

In the fabrication of the example acoustic bandgap device according to the principles herein, no release step is needed. However, in some example, a release step may be performed. A release step can be used to create air/vacuum cavities.

An example acoustic bandgap device according to the principles herein can be fabricated without or with minimal violation of DRC foundry rules.

In an example acoustic bandgap device according to the principles herein, the resonant cavity is encapsulated by either phononic crystals and/or other solid materials, on all sides. In an example implementation, the performance of an example acoustic bandgap device can be enhanced by removing at least a portion of the bulk of the wafer, such as but not limited to by polishing, and forming a free boundary condition under the resonant cavity to avoid losses into the bulk.

Any example acoustic bandgap device according to the principles herein can be fabricated thorough selective material choices in a CMOS or other semiconductor fabrication tool, and patterning of those materials to form a 1D, 2D or half-3D structure around a resonator for acoustic confinement.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An acoustic bandgap device formed using a semiconductor fabrication tool, the semiconductor fabrication tool having a minimal feature thickness and an allowable via width based on a design rule check of the semiconductor fabrication tool, the device comprising:
    a substrate lying in an x-y plane defining an x-direction and a y-direction;
    an acoustic resonant cavity disposed over the substrate;
    a phononic crystal disposed over the acoustic resonant cavity, the phononic crystal comprising a plurality of unit cells disposed in a periodic arrangement, each unit cell comprising:
    (i) at least one higher acoustic impedance structure having a longitudinal axis oriented in the y-direction and a thickness in the x-direction greater than or about equal to the minimal feature thickness of the semiconductor fabrication tool, the at least one higher acoustic impedance structure comprising at least one of:
        at least one via structure, each via structure having a width in the x-direction about equal to the allowable via width of the semiconductor fabrication tool; and
        at least one longitudinal bar, each longitudinal bar having a width in the x-direction greater than the width of the at least one via structure; and
    (ii) at least one lower acoustic impedance material bordering at least a portion of the at least one higher acoustic impedance structure and forming at least a portion of a remainder of the respective unit cell;
    wherein a ratio of an acoustic impedance of the higher acoustic impedance structure to an acoustic impedance of the lower acoustic impedance material is greater than 1.0; and
    wherein the phononic crystal suppresses phononic excitations in at least one frequency band, thereby providing at least one phononic bandgap.

2. The device of claim 1, wherein the higher acoustic impedance structure comprises at least one of tungsten, copper, or molybdenum.

3. The device of claim 1, wherein the higher acoustic impedance structure comprises at least one via structure comprising tungsten.

4. The device of claim 1, wherein the lower acoustic impedance material is a dielectric material.

5. The device of claim 4, wherein the dielectric material comprises SiCOH, a phosphosilicate glass, an oxide or a nitride of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

6. The device of claim 1, wherein the lower acoustic impedance material comprises a parylene, a polyvinylphenol, a polyvinylalchohol, a polythienylene vinylene, a functionalized pentacene, a polydimethylsiloxane, or any combination thereof.

7. The device of claim 1, wherein the lower acoustic impedance material comprises at least one longitudinal rectangular structure comprising aluminum.

8. The device of claim 1, wherein the phononic crystal comprises at least one layer of the unit cells, formed in a one-dimensional arrangement of the plurality of the unit cells.

9. The device of claim 1, wherein the phononic crystal comprises at least one layer of the unit cells, each layer comprising a periodic, two-dimensional arrangement of the plurality of the unit cells.

10. The device of claim 1, wherein the at least one higher acoustic impedance structure comprises at least one longitudinal bar, and wherein the at least one longitudinal bar has a square-shaped cross-section, a rectangular-shaped cross-section, a hexagonal-shaped cross-section, or other polygonal-shaped cross-section.

11. The device of claim 10, wherein the at least one higher acoustic impedance structure comprises at least one via structure and at least one longitudinal bar, and wherein the at least one higher acoustic impedance structure is formed as a connected-H-shaped structure, a connected-I-shaped structure, a staggered-I-shaped structure, or a Z-shaped structure.

12. The device of claim 1, wherein the substrate comprises silicon, a SOI technology substrate, gallium arsenide, gallium phosphide, gallium nitride, or indium phosphide.

13. The device of claim 1, further comprising at least one acoustic Bragg reflector structure disposed proximate to the resonant cavity.

14. The device of claim 1, wherein the acoustic resonant cavity comprises at least one field-effect transistor or at least one capacitor.

15. The device of claim 14, wherein the acoustic resonant cavity comprises at least two field-effect transistors, and wherein at least one of the at least two field-effect transistors comprises a drive gate or a sensing gate.

16. The device of claim 1, further comprising a drive mechanism coupled to the resonant cavity, wherein the drive mechanism comprises a metal-insulator-metal (MIM) capacitor, a gate of a metal-oxide-semiconductor field-effect transistor (MOSFET), a p-n junction of a diode, a capacitor, or a bipolar junction transistor.

17. The device of claim 1, wherein a coupling of the phononic crystal to the acoustic resonant cavity facilitates confinement in the acoustic resonant cavity of at least one phononic excitation at a frequency in the at least one frequency band.

18. The device of claim 1, wherein the at least one higher acoustic impedance structure comprises at least one via structure and at least one longitudinal bar, and wherein the at least one longitudinal bar has a first width in the x-direction, thereby generating an acoustic bandgap device having a first bandgap.

19. The device of claim 18, wherein a second acoustic bandgap device having the at least one longitudinal bar with a second width in the x-direction has a second bandgap that is wider than the first bandgap.

20. The device of claim 1, wherein the semiconductor fabrication tool is a 0.35 μm complementary metal-oxide-semiconductor (CMOS) fabrication tool, a 0.25 μm CMOS fabrication tool, a 0.18 μm CMOS fabrication tool, a 0.13 μm CMOS fabrication tool, a 65 nm CMOS fabrication tool, a 45 nm CMOS fabrication tool, a 32 nm CMOS fabrication tool, a 22 nm CMOS fabrication tool, a 65 nm silicon-on-insulator (SOI) fabrication tool, a 45 nm SOI fabrication tool, a 32 nm SOI fabrication tool, a 22 nm SOI fabrication tool, a 14 nm FinFET fabrication tool, a 22 nm FinFET fabrication tool, or a III-V semiconductor fabrication tool.

21. The device of claim 1, wherein the acoustic resonant cavity is fabricated on a portion of the substrate.

22. The device of claim 1, wherein an insulator layer is disposed between a portion of the acoustic resonant cavity and the substrate.

23. At least one radio-frequency micro-electro-mechanical structure (RF MEMS) device comprising at least one acoustic bandgap device of claim 1.

24. A wireless communication device comprising the at least one RF MEMS device of claim 23.

25. A microprocessor comprising the at least one RF MEMS device of claim 23.

26. A method of producing an acoustic bandgap device formed using a semiconductor fabrication tool, the semiconductor fabrication tool having a minimal feature thickness and an allowable via width based on a design rule check of the semiconductor fabrication tool, the method comprising:
fabricating an acoustic resonant cavity over a substrate lying in an x-y plane defining an x-direction and a y-direction;
fabricating a phononic crystal over the acoustic resonant cavity using a method comprising:
(i) generating the phononic crystal as a plurality of unit cells disposed in a periodic arrangement, each unit cell comprising:
a) at least one higher acoustic impedance structure having a longitudinal axis oriented in the y-direction and a thickness in the x-direction greater than or about equal to a minimal feature thickness of the semiconductor fabrication tool, the at least one higher acoustic impedance structure comprising at least one of:
at least one via structure, each via structure having a width in the x-direction about equal to an allowable via width of the semiconductor fabrication tool; and
at least one longitudinal bar, each longitudinal bar having a width in the x-direction greater than the width of the at least one via structure; and
b) at least one lower acoustic impedance material bordering at least a portion of the at least one higher acoustic impedance structure and forming at least a portion of a remainder of the respective unit cell;
wherein a ratio of an acoustic impedance of the higher acoustic impedance structure to an acoustic impedance of the lower acoustic impedance material is greater than 1.0; and
wherein the phononic crystal suppresses phononic excitations in at least one frequency band, thereby providing at least one phononic bandgap.

27. The method of claim 26, wherein the at least one higher acoustic impedance structure comprises at least one via structure and at least one longitudinal bar, and wherein the at least one longitudinal bar has a first width in the x-direction, thereby generating an acoustic bandgap device having a first bandgap.

28. The method of claim 27, further comprising generating the at least one longitudinal bar with a second width in the x-direction greater than the first width, thereby generating an acoustic bandgap device having a second bandgap wider than the first bandgap.

29. The method of claim 26, wherein the semiconductor fabrication tool is a 0.35 μm complementary metal-oxide-semiconductor (CMOS) fabrication tool, a 0.25 μm CMOS fabrication tool, a 0.18 μm CMOS fabrication tool, a 0.13 μm CMOS fabrication tool, a 65 nm CMOS fabrication tool, a 45 nm CMOS fabrication tool, a 32 nm CMOS fabrication tool, a 22 nm CMOS fabrication tool, a 65 nm silicon-on-insulator (SOI) fabrication tool, a 45 nm SOI fabrication tool, a 32 nm SOI fabrication tool, a 22 nm SOI fabrication tool, a 14 nm FinFET fabrication tool, a 22 nm FinFET fabrication tool, or a III-V semiconductor fabrication tool.

30. The method of claim 26, wherein the acoustic resonant cavity is fabricated on a portion of the substrate.

31. The method of claim 26, wherein an insulator layer is disposed between a portion of the acoustic resonant cavity and the substrate.

\* \* \* \* \*